US007288360B2

(12) United States Patent
Kunita et al.

(10) Patent No.: US 7,288,360 B2
(45) Date of Patent: Oct. 30, 2007

(54) IMAGE RECORDING MATERIAL

(75) Inventors: Kazuto Kunita, Shizuoka-ken (JP); Ryuki Kakino, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 161 days.

(21) Appl. No.: 10/828,172

(22) Filed: Apr. 21, 2004

(65) Prior Publication Data

US 2004/0214104 A1 Oct. 28, 2004

(30) Foreign Application Priority Data

Apr. 24, 2003 (JP) ............................ 2003-120188

(51) Int. Cl.
*G03F 7/004* (2006.01)

(52) U.S. Cl. .............................. 430/270.1; 430/271.1; 430/302

(58) Field of Classification Search ............ 430/270.1, 430/302, 271.1
See application file for complete search history.

(56) References Cited

U.S. PATENT DOCUMENTS 6,399,279 B1 * 6/2002 Urano et al. ................ 430/302
6,410,207 B1 * 6/2002 Nagasaka et al. ........... 430/302

* cited by examiner

*Primary Examiner*—John S. Chu
(74) *Attorney, Agent, or Firm*—Sughrue Mion Pllc

(57) ABSTRACT

The infrared laser-compatible positive-type image recording materials according to the present invention include a support and a photo/thermosensitive layer formed on the support; and the photo/thermosensitive layer contains an alkali-soluble resin (A), a photothermal converting substance (B) and an ester compound (C) represented by the following General Formula (I), and increases solubility thereof to an alkaline developer as a result exposure to an infrared laser. In the following formula, $R^1$ represents a hydrocarbon group having a pKa of $R^1OH$ in a range of 3 to 10; and $R^2$ represents a hydrocarbon group or a substituted carbonyl group. The invention provides image recording materials compatible with high-output lasers that enable highly-sensitive direct plate making by using digital data from a computer or the like, and provide images excellent in development latitude, contrast, and resolution General Formula (I)

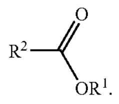

18 Claims, No Drawings

IMAGE RECORDING MATERIAL

CROSS-REFERENCE TO RELATED APPLICATION

This application claims priority under 35 USC 119 from Japanese Patent Application No. 2003-120188, the disclosures of which are incorporated by reference herein.

BACKGROUND OF THE INVENTION

1. Field of the Invention

The present invention relates to an image recording material having a photo/thermosensitive layer on a support, which photo/thermosensitive layer increases solubility thereof to an alkaline developer as a result of exposure to light. More specifically, the present invention relates to a so-called "direct plate-making" positive-type image recording material, capable of direct plate-making by scanning a high-energy density laser beam, such as an infrared laser, on the basis of digital signals from computers or the like.

2. Description of the Related Art

In recent years, progress in lasers has been rapid, and, in particular, solid state and semiconductor lasers with higher outputs and smaller in size; with emission wavelengths in a range between the near-infrared region and the infrared region, have become more readily available. A method whereby the solubility of the photosensitive resin is changed by exposure to light, to record images thereon, by using one of these high-output lasers (usually, having an exposure energy density of more than 5 to 10 $kW/cm^2$) is called a heat-mode or a thermal recording method. In the planographic printing field, these methods have attracted attention recently as recording methods for direct plate-making based on digital data from computers and the like.

More specifically, products produced by the aforementioned method and sold in the market include thermal positive-type planographic printing plate precursors having on a support a photosensitive layer that becomes more soluble as a result of exposure to high-output lasers (hereinafter, referred to as positive-type photosensitive layers) and thermal negative-type planographic printing plates having on a support a photosensitive layer that becomes less soluble as a result of exposure to high-output lasers (hereinafter, referred to as negative-type photosensitive layers).

Positive image recording materials for direct plate making using infrared lasers are image recording materials including both a substance that generates heat by absorbing light and a positive-type photosensitive compound, such as a quinone diazide compound or the like, dispersed together in an alkali-soluble resin. In such image recording materials, images are formed by a mechanism in which the positive-type photosensitive compound functions substantially as a solubilization-suppressing agent which reduces the solubility of the aqueous alkaline solution-soluble resin (which resin will hereinafter be referred to as "an alkali-soluble resin") in the image portions, while, in the non-image portions, as a result of decomposition by heat, the compound becomes unable to exert the same solubilization-suppressing effect, whereby resin in the non-image portions is removed in the process of developing and images are formed. Hitherto, various alkali-soluble resins and solubilization-suppressing agents have been proposed (e.g., see Japanese Patent Applications Laid-Open (JP-A) Nos. 7-285275 and 10-268512, and Japanese Patent Application National Publication (Laid-Open) No. 11-506550).

However, photosensitive compositions, which are known in the art, and which have been used as recording layers of known thermal positive-type planographic printing plate precursors, have a problem, insofar that difference in the solubility thereof to a developer between the exposed and nonexposed portions (which difference will hereinafter be referred to, for the sake of convenience, as "discrimination in solubility") is insufficient, whereby excess development or insufficient development is caused depending on variations in the application conditions. This results in insufficient contrast of images after exposure and development.

Specifically with regard to conventional positive-type image forming materials, images have been formed by modifying the alkali solubility of alkali-soluble resins, mainly by means of thermal breakage of electrostatic interactions between resins and solubilization-suppressing agents, and by removing, in the course of development exposed portions in which resins have become more soluble. Because changes in alkali solubility are produced merely by modest changes in structure caused by heat, such image forming materials have inevitably entailed problems of poor discriminations in solubility, and inferior image contrast.

In order to improve discriminations of images formed by the positive-type planographic printing plate materials, for example, a method of adding a phenolic hydroxyl group-containing compound has been proposed (e.g., see JP-A No. 2000-241966). However, although the phenolic hydroxyl group-containing compound makes removal of the non-image portion by the alkali developer easy (i.e., achieves enhanced solubility of the non-image portion to the alkali developer), the compound also enhances solubility of the image portion, which results in deterioration in sharpness of images. This tendency is conspicuous, in particular, in regions of images like fine lines and dots which take up a relatively small percentage of the image portion. In view of this, the conventional phenolic hydroxyl group-containing compound needs to be improved especially in contrast.

SUMMARY OF THE INVENTION

The invention has been made to overcome the problems described above, and to provide a positive-type image recording material that, by recording images with infrared lasers, guarantees highly-sensitive direct plate-making on the basis of digital data from computers or the like and provides images excellent in development latitude and in resolution and contrast even in regions having many dots and thin lines.

As a result of intensive studies, the inventors have discovered that, with the addition of a specific ester compound into the photo/thermosensitive layer of image recording materials, the above object can be achieved.

A first aspect of the invention is to provide a positive-type image recording material including: a support; and a photo/thermosensitive layer formed on the support, wherein the photo/thermosensitive layer includes an alkali-soluble resin (A), a photothermal converting substance (B), an ester compound (C) represented by General Formula (I), and increases solubility thereof to an alkaline developer as a result of exposure to an infrared laser.

General Formula (I)

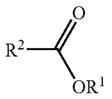

wherein, $R^1$ represents a hydrocarbon group having a pKa of $R^1OH$ in a range of 3 to 10; and $R^2$ represents a hydrocarbon group or a substituted carbonyl group.

A second aspect of the invention is to provide a positive-type image recording material including: a support; a first layer which is formed on the support and is soluble in an alkaline developer; and a second layer which is formed on the first layer and increases solubility thereof to the alkaline developer as a result of exposure to an infrared laser, wherein at least one of the first and second layers includes the ester compound represented by General Formula (I).

In a preferred embodiment, the ester compound represented by General Formula (I) is preferably included in the first layer which is soluble in an alkaline developer, of the recording layers in multilayer structure described above.

Although the precise reasons are still not completely clear, the mechanism of action of the invention is considered to occur in the following way. Because of the characteristic structure of the ester portion thereof, the compound (C) represented by General Formula (I), which is added to the photo/thermosensitive layer of the image recording material, facilitates interactions (by hydrogen bonding or the like) between itself and acid groups in the alkali-soluble resin. The compound consequently suppresses effectively the alkali solubility of unexposed portions (image portions) so that unexposed portions exhibit non-solubility to an alkaline developer. On the other hand, in exposed portions (non-image portions), such interactions are easily destroyed by heat, and the structure of the ester portion is hydrolyzed to the corresponding carboxylic acid, making the resin more soluble in the alkali solution.

In addition, the effects are particularly pronounced in regions having thin lines, small dots, and the like. As a result, it is considered that the compound (C) suppresses a deterioration in resolution and a discrimination in development, which have conventionally been disadvantages associated with increases in sensitivity. In other words, it is considered that the compound (C) can effect exhibition of high resolution and high discrimination in development while at the same time maintaining a high degree of sensitivity.

DETAILED DESCRIPTION OF THE INVENTION

Photo/thermosensitive layers of the positive-type image recording material according to the invention contains an alkali-soluble resin (A), a photothermal converting substance (B), and an ester compound (C) represented by the General Formula (I) [hereinafter, referred to as the "specific ester compound (C)"], and increases solubility thereof to an alkaline developer by exposure to infrared laser. Hereinafter, individual components used in the image recording material according to the invention will be described one by one.

The photo/thermosensitive layer in the image recording material according to the invention may have either a single- or multi-layered structure. If an image recording material has a multilayer structure, the component characteristic of the invention, i.e., the ester compound (C) represented by the General Formula (I), may be contained in any layer in the multilayer structure, but is preferably contained particularly in the first layer soluble in an alkaline developer that is formed between the support and the layer(s) reactive to infrared laser, from the viewpoint of merit. [Ester compound (C) represented by the General Formula (I)]

The ester compound (C), as the component characteristic of the invention, is a compound represented by the following General Formula (I).

General Formula (I)

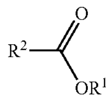

In the formula, $R^1$ represents a hydrocarbon group having a pKa of $R^1OH$ in the range of 3 to 10. The hydrocarbon groups include alkyl and aryl groups that have a pKa in the range above. Introduction of one or more electron-withdrawing substituents into the hydrocarbon group represented by $R^1$ allows $R^1OH$ to have a pKa in the range above.

Hydrocarbon groups preferable as $R^1$ include hydrocarbon having 1 to 20 carbon atoms, preferably alkyl groups having 1 to 20 carbon atoms and aryl groups having 6 to 20 carbon atoms.

Particularly preferable examples of alkyl groups include methyl, ethyl, propyl, butyl, hexyl, dodecyl, isopropyl, isobutyl, cyclohexyl groups, and also unsaturated hydrocarbon groups such as benzyl, vinyl, aryl, and hexenyl groups.

Particularly preferable examples of aryl groups include phenyl, naphthyl, anthranyl groups, and the aryl groups in the invention also include heterocyclic examples of aromatic groups such as pyridinyl, furanyl, and thiophenyl.

These hydrocarbon groups may have one or more additional substituents. Preferable examples of substituents include substituted oxy groups such as alkoxy, aryloxy, acylhydroxy (ester), and sulfonylhydroxy (sulfonic ester) groups; substituted thio groups such as alkylthio, arylthio, acylthio, and sulfonylthio (sulfonic thioester) groups; substituted amino groups such as alkylamino, arylamino, acylamino (amide), and sulfonylamino (sulfonic amide) groups; halogen atoms, and cyano, nitro, carboxyl, substituted carbonyl ($R^4$—C(=O)—), and substituted sulfonyl ($R^5$—S(=O)$_2$—) groups. Herein, $R^4$ are $R^5$ each represent a hydrogen atom, a hydrocarbon, substituted oxy, substituted thio, or substituted amino group.

The hydrocarbon groups above are preferably substituted with at least one electron-withdrawing substituent among the substituents above, which is more specifically selected from halogen atoms, and cyano, nitro, carboxyl, substituted carbonyl ($R^4$—C(=O)—), and substituted sulfonyl ($R^5$—S(=O)$_2$—) groups.

Particularly preferable specific examples of $R^1$ include groups such as trifluoromethoxy, trichloromethyl, dichloromethyl, tribromomethyl, perfluoroethyl, perfluorobutyl, cyanomethyl, nitromethyl, fluorophenyl, chlorophenyl, bromophenyl, cyanophenyl, nitrophenyl, dichlorophenyl, trichlorophenyl, trifluoromethoxyphenyl, acetylphenyl, diacetylphenyl, benzoylphenyl, methoxycarbonylphenyl, phenoxycarbonylphenyl, methanesulfonyl, toluenesulfonylphenyl, chlorophenylsulfonylphenyl groups; and phenyl groups and heterocyclic aromatic groups such as pyridinyl having at least 2 or more electron-withdrawing substituents described above.

In the General Formula (I), $R^2$ represents a hydrocarbon group or a substituted carbonyl group. The hydrocarbon groups are the same as those for $R^1$, and the substituents that may be introduced thereto are also the same. In addition, the substituted carbonyl groups are also the same as the substituted carbonyl group ($R^1$—C(═O)—) described in the description of the substituent above (i.e., $R^4$ represents a hydrogen atom, or a hydrocarbon, substituted oxy, substituted thio, or substituted amino group.)

The ester compounds represented by the General Formula (I) are more preferably, the compounds represented by the following General Formula (II), i.e., the compounds represented by the General Formula (I) having an unsaturated hydrocarbon group as $R^2$; or, the compounds represented by the General Formula (III), i.e., the compounds represented by the General Formula (I) having a substituted carbonyl group as $R^2$.

The most preferable ester compounds are compounds represented by the following General Formula (IV), i.e., the compounds represented by the General Formula (I) having an unsaturated hydrocarbon group as $R^2$ and an aryl group ($Ar^1$) having a pKa of $Ar^1(R^1)OH$ in the range of 3 to 10 as $R^1$, or compounds represented by the following General Formula (V), i.e., the compounds represented by the General Formula (I) having a substituted carbonyl group as $R^2$ and an aryl group ($Ar^1$) having a pKa of $R^1OH$ in the range of 3 to 10 as $R^1$.

(II)

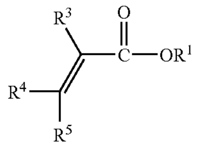

(III)

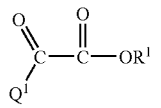

(IV)

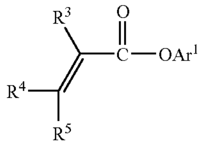

(V)

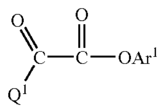

In General Formulae (II) to (V), $R^3$ to $R^5$ each independently represent a hydrogen atom or a hydrocarbon group, and $Q^1$ represents a hydrocarbon, or a substituted oxy, substituted amnino, or substituted thio group. $Ar^1$ represents an aryl group having a pKa of $Ar^1OH$ in the range of 3 to 10.

The ester compounds (C) represented by the General Formula (I) can be easily prepared for example by condensation of the corresponding carbonic acid ($R^2CO_2H$) and alcohol ($R^1OH$).

Hereinafter, typical examples of the ester compound (C) represented by the General Formula (I) (exemplary compounds I-1 to I-54) are described, but the invention shall not be restricted by these compounds. In the following exemplary compounds, compounds (I-1) to (I-14) are those represented by the General Formula (IV); compounds (I-15) to (I-30), the General Formula (V); compounds (I-31) to (I-36), the General Formula (II); and compounds (I-37) to (I-41), the General Formula (III).

I-1

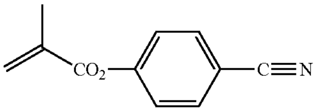

I-2

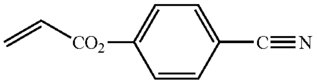

I-3

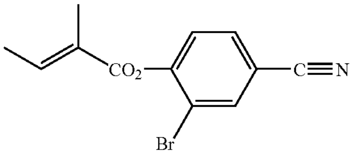

I-4

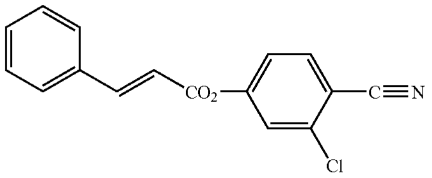

I-5

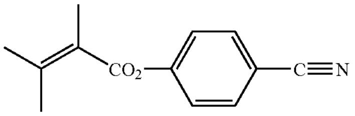

I-6

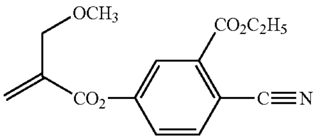

I-7

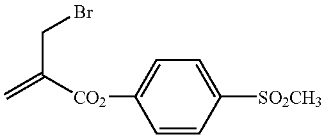

I-8

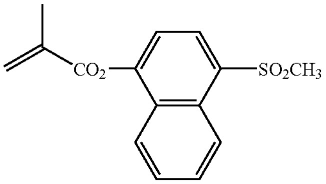

I-9

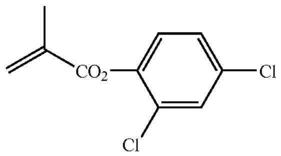

I-10

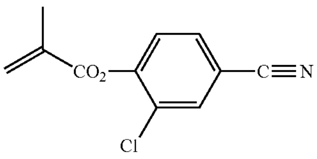

-continued
I-11
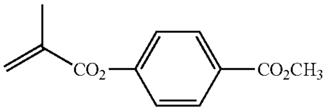
I-12
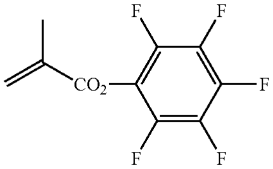
I-13
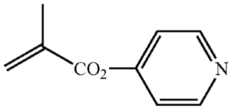
I-14
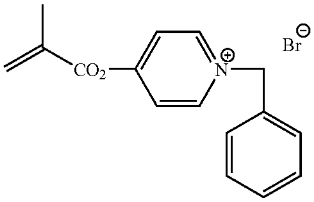
I-15
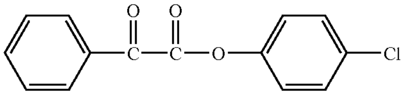
I-16
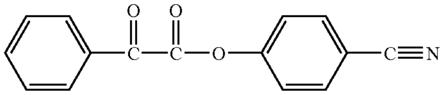
I-17
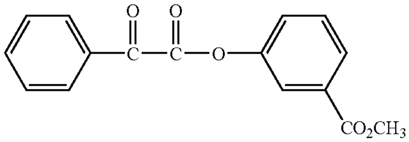
I-18
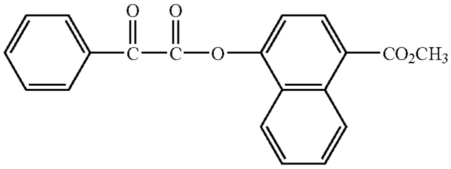
I-19
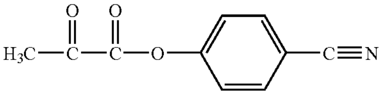
I-20
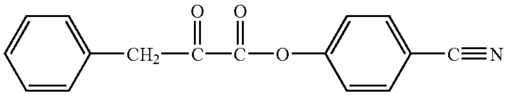
I-21
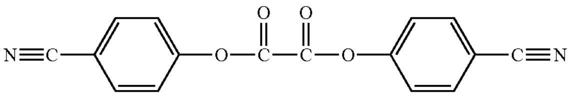
-continued
I-22
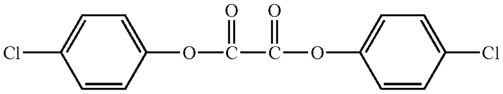
I-23
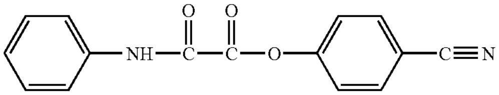
I-24
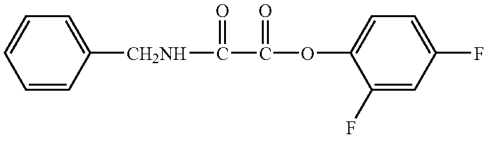
I-25
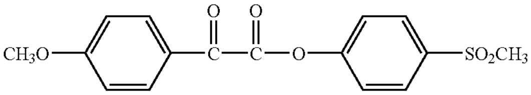
I-26
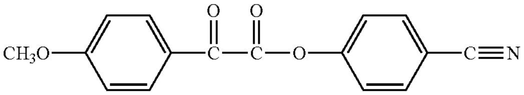
I-27
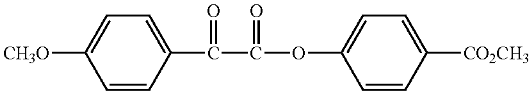
I-28
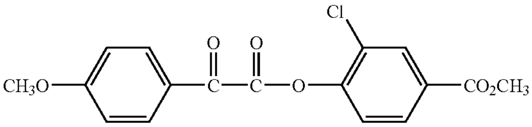
I-29
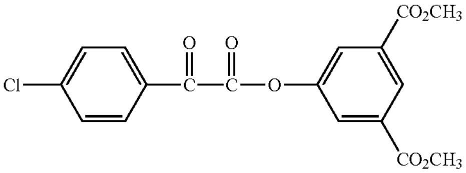
I-30
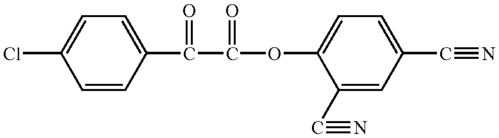
I-31
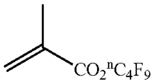
I-32
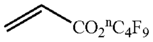
I-33
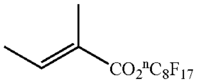

-continued

I-34

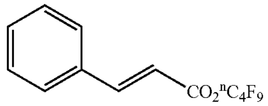

I-35

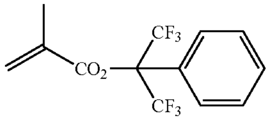

I-36

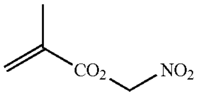

I-37

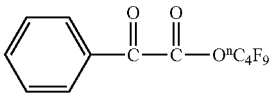

I-38

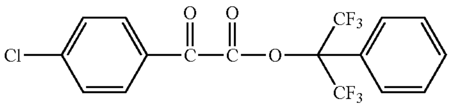

I-39

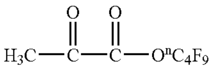

I-40

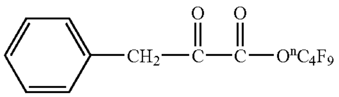

I-41

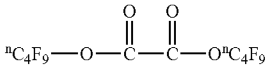

I-42

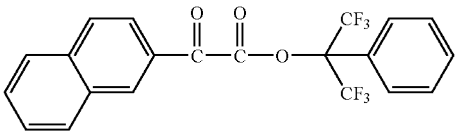

I-43

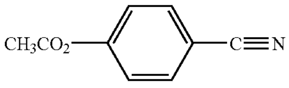

I-44

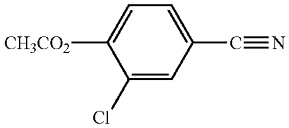

I-45

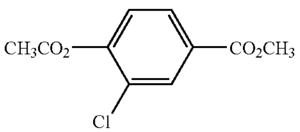

I-46

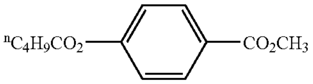

I-47

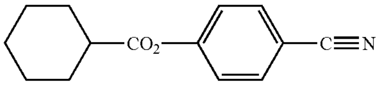

-continued

I-48

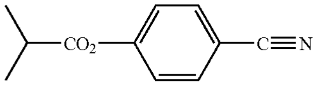

I-49

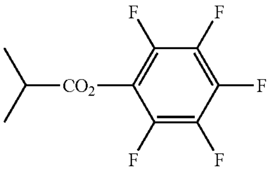

I-50

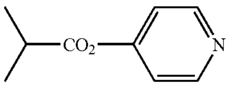

I-51

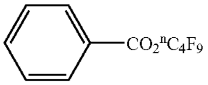

I-52

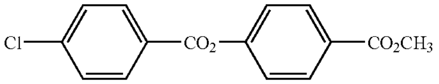

I-53

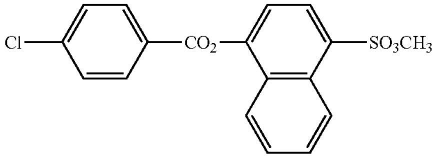

I-54

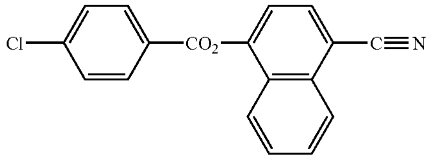

The specific ester compounds (C) may be used alone or as a mixture of two or more of them in the invention.

The specific ester compound (C) according to the invention is preferably added in an amount of 0.01 to 50.0% by mass, particularly preferably in an amount of 0.5 to 30.0% by mass, with respect to the total amount of the solid contents in the photo/thermosensitive layer, for the purpose of providing the advantageous effects of the invention, i.e., superiority in development latitude and image contrast as well as in film property of the coated layer.

[Alkali-Soluble Resin (A)]

The alkali-soluble resins (A) used in the image recording materials according to the invention include homopolymers containing acidic groups bound to the main and/or side-chains of the polymers, copolymers thereof, and the mixtures thereof.

Among them, the polymers having one of more of the following acidic groups (1) to (6) bound to the main and/or side chain of the polymers are preferable, from the viewpoints of the development endurance and solubility in aqueous alkaline solutions.

(1) Phenol group (—Ar—OH)

(2) Sulfonamide group ($—SO_2NH—R$)

(3) Substituted sulfonamide acidic group (hereinafter, referred to as the "active imide group") [$—SO_2NHCOR$, $—SO_2NHSO_2R$, or $—CONHSO_2R$]

(4) Carboxylic acid group ($—CO_2H$)

(5) Sulfonic acid group ($—SO_3H$)

(6) Phosphoric acid group ($—OPO_3H_2$)

In the groups (1) to (6) above, Ar represents a bivalent aryl-connecting group which may have one or more substituents, and R, a hydrocarbon group which may have one or more substituents.

Among the alkali-soluble resins having an acidic group selected from the groups (1) to (6) above, alkali-soluble resins having a (1) phenol, (2) sulfonamide, or (3) active imide group are preferable, and in particular, alkali-soluble resin having a (1) phenol or (2) sulfonamide group are most preferable, from the viewpoint of solubility in the alkaline developer, development latitude, and film strength.

Examples of the alkali-soluble resins having an acidic group selected from the groups (1) to (6) above are described below.

(1) Examples of the alkali-soluble resins having a phenol group include condensation polymers of phenol and formaldehyde, condensation polymers of m-cresol and formaldehyde, condensation polymers of p-cresol and formaldehyde, condensation polymers of mixed m-/p-cresol and formaldehyde, novolak resins such as condensation polymers of phenol and cresol (either m-, p-, or mixed m-/p-) with formaldehyde, and condensation polymers of pyrogallol and acetone. Suitable examples also include copolymers obtained by copolymerizing a compound having a phenol group as its side group.

Examples of the compounds having a phenol group include acrylamide, methacrylamide, acrylic ester, methacrylic ester, hydroxystyrene and the like, having the phenol group.

(2) Examples of the alkali-soluble resins having a sulfonamide group include polymers having a minimal constituent unit derived from the compounds having a sulfonamide group as the main constituent unit. Such compounds include compounds having at least one sulfonamide group with at least one hydrogen atom bound to the nitrogen atom thereof and at least one polymerizable unsaturated group respectively in the molecule. Among them, preferable are low molecular weight compounds having: an acryloyl, allyl, or vinyloxy group; and a substituted or monosubstituted amino sulfonyl or substituted sulfonyl imino group; in the molecule, and examples thereof are compounds represented by the following General Formulae (i) to (v).

(i)

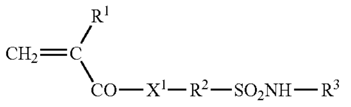

(ii)

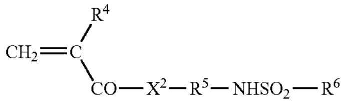

(iii)

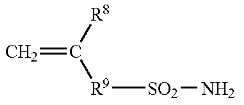

(iv)

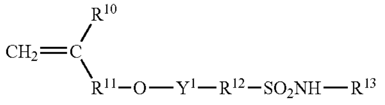

-continued (v)

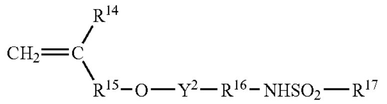

wherein, $X^1$ and $X^2$ each independently represent —O— or $—NR^7$; $R^1$ and $R^4$ each independently represent a hydrogen atom or $—CH_3$; $R^2$, $R^5$, $R^9$, $R^{12}$, and $R^{16}$ each independently represent an alkylene, cycloalkylene, arylene or aralkylene group having 1 to 12 carbons which may have one or more substituents; $R^3$, $R^7$, and $R^{13}$ each independently represent a hydrogen atom, or an alkyl, cycloalkyl, aryl or aralkyl group having 1 to 12 carbons which may have one or more substituents; $R^6$ and $R^{17}$ each independently represent an alkyl, cycloalkyl, aryl, or aralkyl group having group having 1 to 12 carbons which may have one or more substituents; $R^8$, $R^{10}$ and $R^{14}$ each independently represent a hydrogen atom or $—CH_3$; $R^{11}$ and $R^{15}$ each independently represent a single bond or an alkylene, cycloalkylene, arylene or aralkylene group having 1 to 12 carbons which may have one or more substituents; and $Y^1$ and $Y^2$ each represent independently a single bond or —CO—.)

In particular among the compounds represented by the General Formulae (i) to (v), m-aminosulfonylphenyl methacrylate, N-(p-aminosulfonylphenyl)methacrylamide, N-(p-aminosulfonylphenyl)acrylamide, and the like are preferably used for the image recording material according to the invention.

(3) Examples of the alkali-soluble resins having an active imide group include polymers having a minimal constituent unit derived from the compounds having an active imide group as the main constituent unit. Such compounds include compounds having at least one active imide group represented by the following formula and at least one polymerizable unsaturated group.

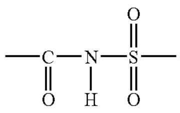

More specifically, N-(p-toluenesulfonyl)methacrylamide, N-(p-toluenesulfonyl)acrylamide, and the like may be favorably used.

(4) Examples of the alkali-soluble resins having a carboxylic acid group include polymers having a minimal constituent unit derived from the compounds having at least one carboxylic acid and polymerizable unsaturated groups respectively in the molecule as the main constituent unit.

(5) Examples of the alkali-soluble polymers having a sulfonic acid group include polymers having a minimal constituent unit derived from the compounds having at least one sulfonic acid and polymerizable unsaturated groups respectively in the molecule as the main constituent unit.

(6) Examples of the alkali-soluble resins having a phosphoric acid group include polymers having a minimal constituent unit derived from the compounds having at least one phosphoric acid and polymerizable unsaturated groups respectively in the molecule as the main constituent unit.

The minimal constituent unit having the acidic group, selected from the groups (1) to (6) above, of the alkali-soluble resins for use in the image recording material according to the invention is not necessarily a single compound, and thus copolymers obtained by copolymerization of two or more minimal constituent units having the same acidic group or of two or more minimal constituent units having different acidic groups may also be used.

Such copolymers preferably contain the copolymerization compounds having the acidic group selected from the groups (1) to (6) in an amount of 10% by mole or more, more preferably in the amount of 20% by mole or more in the copolymers. A content of less than 10% by mole tends to result in insufficient improvement in development latitude.

In the invention, other compounds that do not have the acidic group represented by the groups (1) to (6) above may be used as the copolymerization compounds, when a copolymer by copolymerization of compounds is used as the alkali-soluble resin. Examples of the other compounds not having any of the acidic groups (1) to (6) include, but are not limited to, compounds (m1) to (m12) below:

(m1) Acrylic and methacrylic esters having one or more aliphatic hydroxyl groups such as 2-hydroxyethyl acrylate or 2-hydroxyethyl methacrylate;

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate;

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate;

(m4) Acrylaamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide;

(m5) Vinylethers such as ethylvinylether, 2-chloroethylvinylether, hydroxyethylvinylether, propylvinylether, butylvinylether, octylvinylether, and phenylvinylether;

(m6) Vinylesters such as vinyl acetate, vinyl chloroacetate, vinyl butyrate, and vinyl benzoate;

(m7) Styrenes such as styrene, α-methylstyrene, methylstyrene, and chloromethylstyrene;

(m8) Vinylketones such as methylvinylketone, ethylvinylketone, propylvinylketone, and phenylvinylketone;

(m9) Olefins such as ethylene, propylene, isobutylene, butadiene, and isoprene;

(m10) N-Vinylpyrrolidone, acrylonitrile, and methacrylonitrile;

(m11) Unsaturated imides such as maleimide, N-acryloylacrylamide, N-acetylmethacrylamide, N-propionylmethacrylamide, and N-(p-chlorobenzoyl) methacrylamide; and (m12) Unsaturated carboxylic acids such as acrylic acid, methacrylic acid, maleic anhydride, and itaconic acid.

The alkali-soluble resin preferably has a phenolic hydroxyl group, as such resins provide better images by exposure to infrared laser or the like. Accordingly, phenol formaldehyde resins, m-cresol formaldehyde resins, p-cresol formaldehyde resins, novolak resins such as mixed m-/p-cresol formaldehyde resins and mixed phenol/cresol (either m-, p-, or mixed m-/p-) formaldehyde resins, and pyrogallol acetone resins are favorably used as the resin.

In addition, the alkali-soluble resins having a phenolic hydroxyl group further include condensation polymers of formaldehyde and the phenols having an alkyl group having 3 to 8 carbons as the substituent such as t-butylphenol formaldehyde resins and octylphenol formaldehyde resins described in U.S. Pat. No. 4,123,279.

The alkali-soluble resin preferably has a weight-average molecular weight of 500 or more, more preferably of 1,000 to 700,000, form the viewpoint of image-forming property. Additionally, the number-average molecular weight thereof is preferably 500 or more, more preferably 750 to 650,000. The molecular weight distribution (weight-average/number-average molecular weight) is preferably 1.1 to 10.

These alkali-soluble resins may be used not only alone but also in combinations of two or more resins. If the resins are used in combination, condensation polymers of formaldehyde and the phenol having an alkyl group having 3 to 8 carbons as the substituent, such as condensation polymer of phenol from t-butyl and formaldehyde and condensation polymers of octylphenol and formaldehyde, described in U.S. Pat. No. 4,123,279; or the alkali-soluble resins having a phenol structure with one or more electron-withdrawing groups connected to the aromatic ring described in JP-A No. 2000-241972, which was previously filed by the inventors, may be used together.

The content of the alkali-soluble resin according to the invention is preferably 30 to 98% by mass, more preferably 40 to 95% by mass with respect to the total amount of solid contents in the image recording material, from the viewpoints of durability, sensitivity, and image-forming property.

[Photothermal Converting Substance (B)]

The photothermal converting substances according to the invention are not particularly limited and may be used independently of the absorption wavelength range if they absorb energy-rich irradiated light and convert it into heat, but are preferably infrared absorbing dyes or pigments having the absorption maximum at a wavelength of 760 to 1200 nm, from the viewpoint of compatibility with the easily accessible high-output lasers Commercially available dyes, for example, those known in the art described in literatures such as "Dye Handbook" (Soc. Synthetic Organic Chemistry, Ed., 1970) may be used as the dye. More specifically, examples of the dyes include azo, metal complex salt azo, pyrazolone azo, naphthoquinone, anthraquinone, phthalocyanine, carbonium, quinonimine, methine, cyanine, squarylium, pyrylium salt, metal thiolate complex, oxonol, diimmonium, aminium, chroconium and other dyes.

Examples of the preferable dyes include cyanine dyes disclosed in JP-A Nos. 58-125246, 59-84356, 59-202829, and 60-78787; methine dyes disclosed in JP-A Nos. 58-173696, 58-181690, and 58-194595; naphthoquinone dyes disclosed in JP-A Nos. 58-112793, 58-224793, 59-48187, 59-73996, 60-52940, and 60-63744; squarylium dyes disclosed in JP-A No. 58-112792; cyanine dye disclosed in U.K. Patent No. 434,875; and the like.

Favorable examples of the dyes also include infrared-absorbing sensitizers disclosed in U.S. Pat. No. 5,156,938; substituted arylbenzo(thio)pyrylium salts disclosed in U.S. Pat. No. 3,881,924; trimethine thiapyrylium salts disclosed in JP-A No. 57-142645 (U.S. Pat. No. 4,327,169); pyrylium compounds disclosed in JP-A Nos. 58-181051, 58-220143, 59-41363, 59-84248, 59-84249, 59-146063, and 59-146061; cyanine dyes disclosed in JP-A No. 59-216146; pentamethine thiopyrylium groups disclosed in U.S. Pat. No. 4,283,475; and pyrylium compounds disclosed in Japanese Patent Application Publication (JP-B) Nos. 5-13514 and 5-19702.

Other preferable examples of the dyes are those disclosed in U.S. Pat. No. 4,756,993, i.e., infrared-absorbing dyes represented by formulae (I) and (II) therein.

Particularly preferable dyes among these dyes include cyanine, phthalocyanine, oxonol, and squarylium dyes; pyrylium salts, thiopyrylium dyes, and nickel thiolate complexes. Further, the dyes represented by the General Formulae (a) to (e) below are also preferable, as they are superior in photothermal converting efficiency; and in particular cyanine dyes represented by the following General Formula (a) are most preferable, as they have greater interactions with the alkali solubility resin and are superior in stability and economical efficiency.

General Formula (a)

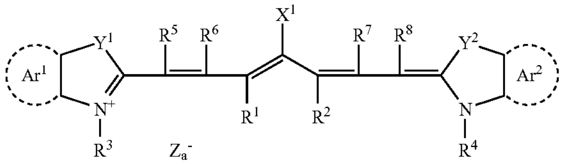

In the General Formula (a), $X^1$ represents a hydrogen or halogen atom, —$NPh_2$, $X^2$-$L^1$ or one of the following groups. Herein, $X^2$ represents an oxygen or sulfur atom; $L^1$, a hydrocarbon group having 1 to 12 carbons, an aromatic ring having one or more heteroatoms, or a hydrocarbon group having 1 to 12 carbons and containing one or more heteroatoms. The heteroatom above represents N, S, O, a halogen atom, or Se.

$L^1$ may be an ionized group such as the one shown in the following formula.

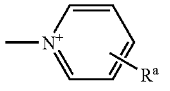

$X_a^-$

In the formula above, $Xa^-$ is defined as the same as $Za^-$ described below; $R^a$ represents a substituent selected from a hydrogen atom, alkyl, aryl, substituted and unsubstituted amino groups, and a halogen atom.

$R^1$ and $R^2$ each independently represent a hydrocarbon group having 1 to 12 carbon atoms. From the viewpoint of the storage stability of the photosensitive layer coating solution, $R^1$ and $R^2$ each are preferably a hydrocarbon group having two or more carbon atoms, and more preferably $R^1$ and $R^2$ bind to each other forming a 5-membered ring or 6-membered ring.

$Ar^1$ and $Ar^2$ may be the same or different from each other, and each represent an aromatic hydrocarbon group that may have one or more substituents. Preferable examples of aromatic hydrocarbon group include those having benzene and naphthalene rings. Preferable examples of substituents include hydrocarbon groups having 12 or fewer carbon atoms, halogen atoms, alkoxy groups having 12 or fewer carbon atoms. $Y^1$ and $Y^2$ may be the same or different from each other, and each represent a sulfur atom or a dialkylmethylene group having 12 or fewer carbon atoms. $R^3$ and $R^4$ may be the same or different from each other, and each represent a hydrocarbon group having 20 or fewer carbon atoms which may additionally have one or more substituents. Preferable examples of the substituents include alkoxy groups having 12 or fewer carbon atoms, a carboxyl group, and a sulfo group. $R^5$, $R^6$, $R^7$ and $R^8$ may be the same or different from each other, and each represent a hydrogen atom or a hydrocarbon group having 12 or fewer carbon atoms. From the availability of raw material, these groups each are preferably a hydrogen atom.

In addition, $Za^-$ represents a counter anion. However, if a cyanine dye represented by the General Formula (a) has an anionic substituent and does not demand neutralization of electric charge, $Za^-$ is not needed. Preferable examples of $Za^-$ are halides, and perchlorate, tetrafluoroborate, hexafluorophosphate, and sulfonate ions, from the viewpoint of the storage stability of photosensitive coating solution, and particularly preferable examples, perchlorate, hexafluorophosphate, and arylsulfonate ions.

Specific examples of the cyanine dyes represented by the General Formula (a) favorably used in the invention include the following compounds as well as those described in paragraph numbers [0017] to [0019] of JP-A No. 2001-133969; paragraph numbers [0012] to [0038] of JP-A No. 2002-40638; and paragraph numbers [0012] to [0023] of JP-A No. 2002-23360.

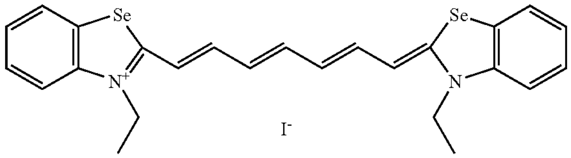

$I^-$

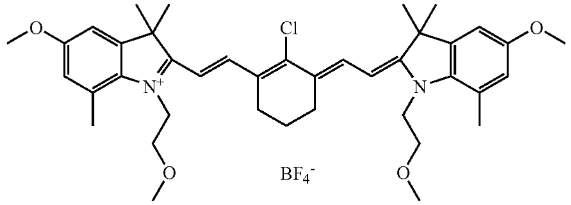

$BF_4^-$

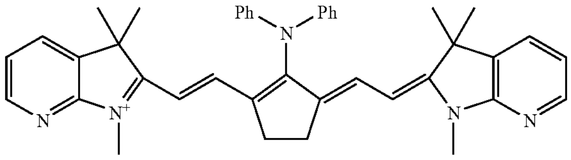

$BF_4^-$

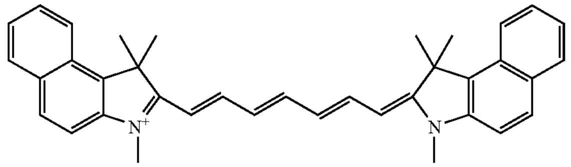

$ClO_4^-$

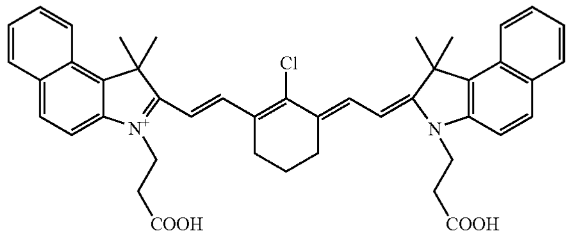

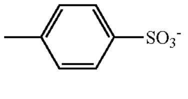

-continued

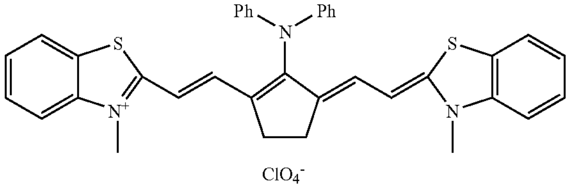

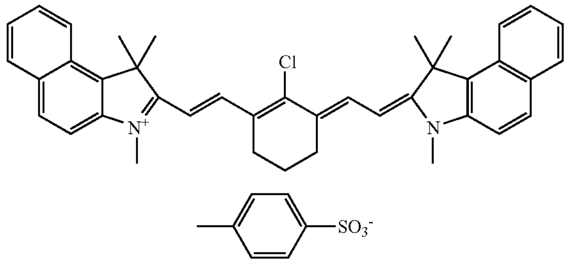

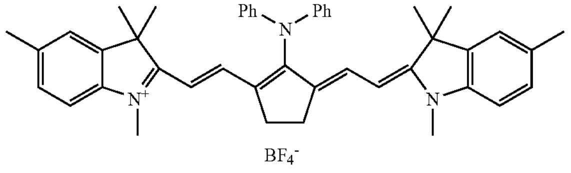

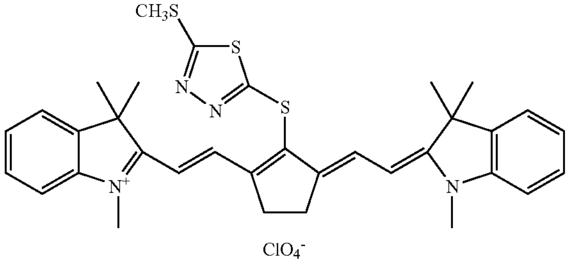

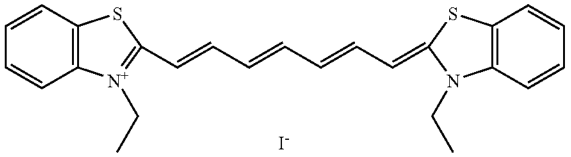

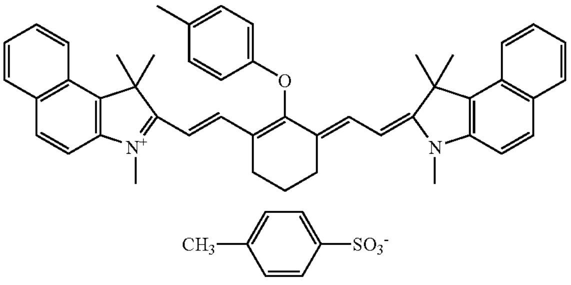

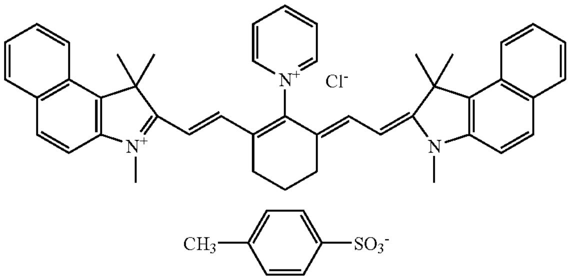

-continued

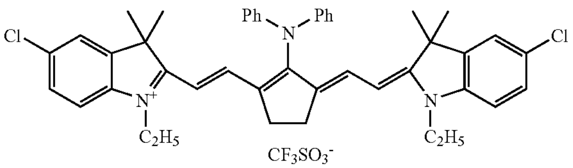

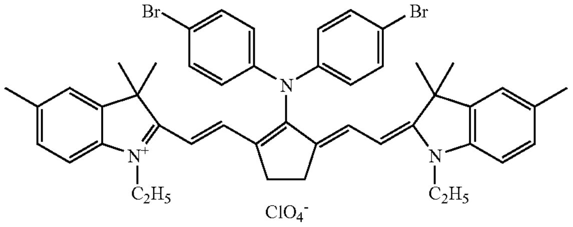

General Formula (b)

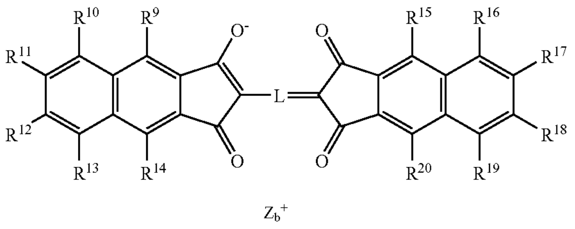

In the General Formula (b) above, L represents a methine chain having 7 or more conjugated carbon atoms, which may have one or more substituents. The substituents may bind to each other forming a ring structure. $Zb^+$ represents a counter cation. Preferable examples of counter cation include ammonium, iodonium, sulfonium, phosphonium, pyridinium, alkali metal cations ($Ni^+$, $K^+$, and $Li^+$), and the like. $R^9$ to $R^{14}$ and $R^{15}$ to $R^{20}$ each independently represent a hydrogen or halogen atom or a substituent selected from cyano, alkyl, aryl, alkenyl, alkynyl, carbonyl, thio, sulfonyl, sulfinyl, hydroxy, and amnino groups, or a substituent consisting of two or three of these groups combined. These substituents may condense with each other forming a ring structure. A cyanine dye wherein in the General Formula (b) above, L represents a methine chain having 7 conjugated carbon atoms and all $R^9$ to $R^{14}$ and $R^{15}$ to $R^{20}$ are a hydrogen atom is preferable, from the viewpoints of availability and technical merit.

Typical examples of the dyes represented by the General Formula (b) favorably used in the invention include the followings:

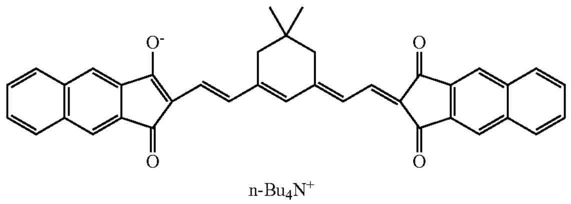

-continued

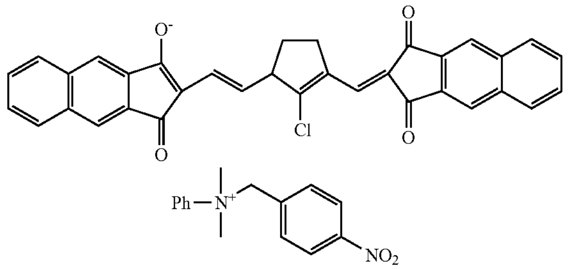

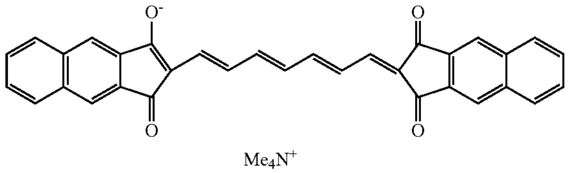

General Formula (c)

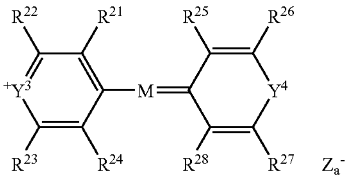

In the General Formula (c) above, $Y^3$ and $Y^4$ each represent an oxygen, sulfur, selenium, or tellurium atom. M represents a methine chain having 5 or more conjugated carbons. $R^{21}$ to $R^{24}$ and $R^{25}$ to $R^{28}$ may be the same or different from each other, and each represent a hydrogen or halogen atom, or a cyano, alkyl, aryl, alkenyl, alkynyl, carbonyl, thio, sulfonyl, sulfinyl, hydroxy, or amino group. In addition, in the formula, $Za^-$ represents a counter anion, which is the same as $Za^-$ in the General Formula (a) above.

Typical examples of the dyes represented by the General Formula (c) favorably used in the invention include the following:

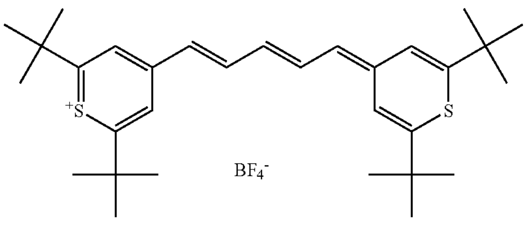

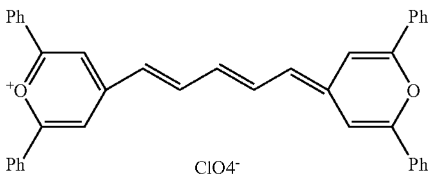

-continued

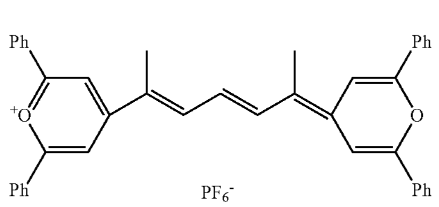

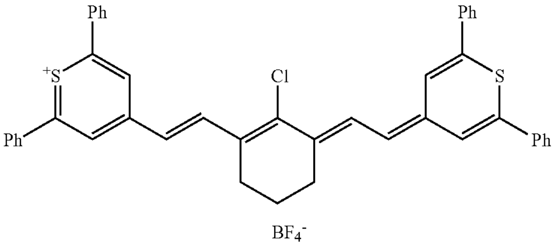

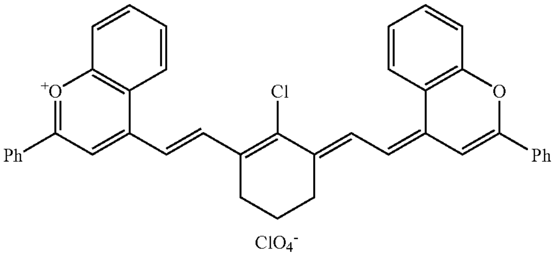

General Formula (d)

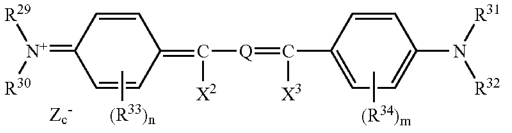

In the General Formula (d) above, $R^{29}$ or $R^{31}$ independently represents a hydrogen atom, or an alkyl or aryl group. $R^{33}$ and $R^{34}$ each independently represent an alkyl, substituted oxy group or a halogen atom. n and m each independently represent an integer of 0 to 4. $R^{29}$ and $R^{30}$, or $R^{31}$ and $R^{32}$ may bind to each other forming a ring; $R^{29}$ and/or $R^{30}$ may bind to $R^{33}$, and $R^{31}$ and/or $R^{32}$ may bind to $R^{34}$ forming a ring; and if multiple $R^{33}$ groups or $R^{34}$ groups are present, $R^{33}$ groups or $R^{34}$ groups may bind to each other forming a ring. $X^2$ and $X^3$ each independently represent a hydrogen atom, or an alkyl or aryl group; and at least one group of $X^2$ and $X^3$ represents a hydrogen atom or an alkyl group. Q represents a trimethine or pentamethine group which may have one or more substituents and may form a ring structure together with a bivalent organic group. $Zc^-$ represents a counter anion, which is the same as $Za^-$ in the General Formula (a) above.

Typical examples of the dyes represented by the General Formula (d) favorably used in the invention include the followings:

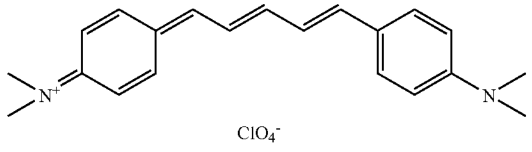

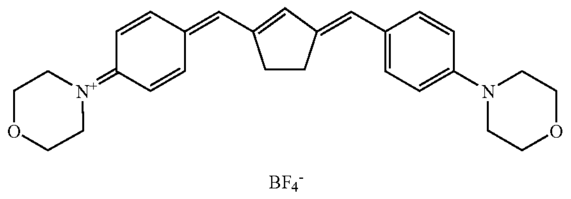

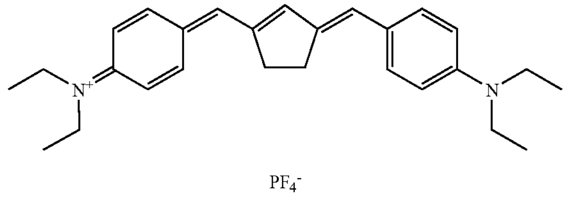

General Formula (e)

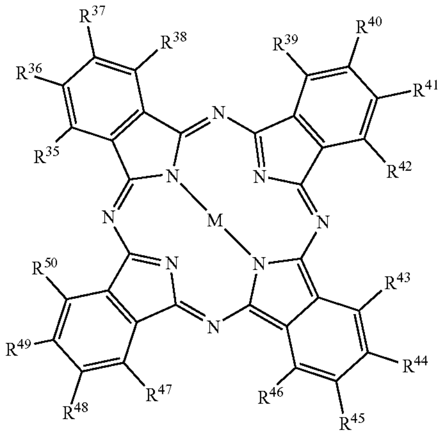

In the General Formula (e) above, $R^{35}$ to $R^{50}$ each independently represent a hydrogen or halogen atom, a cyano or carbonyl group, or an alkyl, aryl, alkenyl, alkynyl, hydroxyl, thio, sulfonyl, sulfinyl, hydroxy, amino, or onium salt group, which may have one or more substituents. M represents two hydrogen atoms, a metal atom, or a halometal or hydroxy metal group. The metal atoms therein include atoms in IA, IIA, IIIB, and IVB groups of periodic table, first-, second- and third-row transition metals, and lanthanoid atoms, and are preferably copper, magnesium, iron, zinc, cobalt, aluminium, titanium, and vanadium.

Typical examples of the dyes represented by the General Formula (e) favorably used in the invention include the followings:

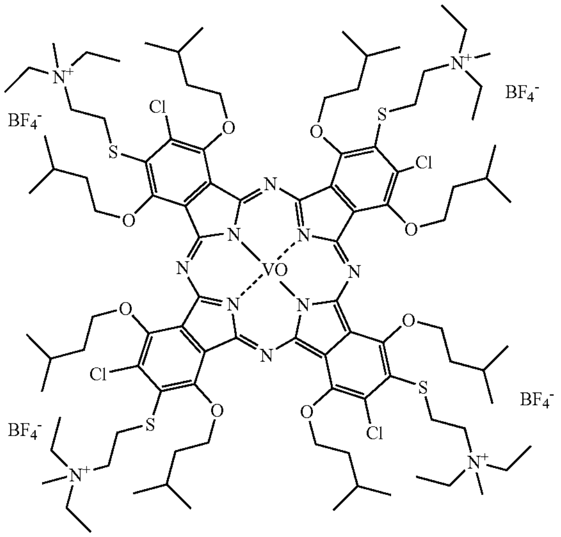

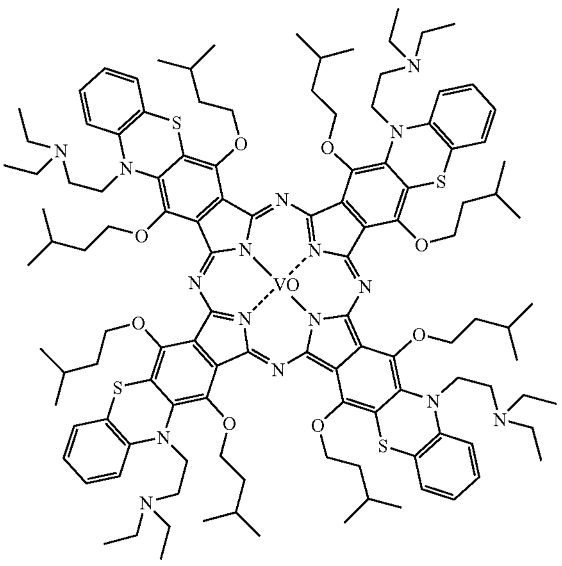

Pigments used as the infrared absorbent in the invention include commercially available pigments and those described in Color Index (C.I.) Handbook, “Pigment Handbook” (Japan Society of pigment technologies, ed., 1977), “State-of-the-art Pigment Application Technologie” (CMC Publishing Co., Ltd., 1986), and “Printing Ink technologies” (CMC Publishing Co., Ltd., 1984).

The pigments include black, yellow, orange, brown, red, purple, blue, green, fluorescent, metal powder, and other pigments as well as polymer-binding dyes. Specific examples of the pigments include insoluble azo pigments, azo lake pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophtharone pigments, dyed lake pigments, azine pigments, nitroso pigments, nitro pigments, natural pigments, fluorescent pigments, inorganic pigments, and carbon black. Among these pigments, carbon black is preferable.

These pigments may be used either with or without surface treatment. The methods for the surface treatment include methods of surface coating with a resin or wax; of attaching a surfactant; of binding a reactive substance (e.g., a silane coupling agent, epoxy compound, polyisocyanate, or the like) to the surface of the pigment; and the like. The above surface treatment methods are described in "Properties and Applications of Metal Soaps" (Saiwai Shobo), "Printing Ink Technologies" (CMC Publishing Co., Ltd., 1984) and "State-of-the-art Pigment Application Technologies" (CMC Publishing Co., Ltd., 1986).

The particle diameter of the pigment is preferably in the range of 0.01 to 10 μm, more preferably of 0.05 to 1 m, particularly preferably of 0.1 to 1 m, from the viewpoints of the dispersion stability and uniformity of the recording layer.

For dispersing the pigment, any one of the dispersion techniques known in the art that are used for production of inks, toners, and the like may be used. Examples of dispersing machines include ultrasonic dispersing machine, sand mill, attriter, pearl mill, super mill, ball mill, impeller, disperser, KD mill, colloid mill, dynatron, three-roll mill, and pressurized kneader. More detailed description on the dispersing machines is found in "State-of-the-Art Pigment Application Technologies" (CMC Publishing Co., Ltd., 1986).

From the viewpoints of sensitivity and film properties, these pigments or dyes each used as the photothermal converting agent are added in an amount of 0.01 to 50% by mass, preferably of 0.1 to 30% by mass, with respect to the total solid contents constituting the photo/thermosensitive layer. If dyes are added, the amount of addition is particularly preferably in the range of 0.5 to 10% by mass, while if pigments are added, the amount is particularly preferably in the range of 0.1 to 10% by mass.

If the pigments or dyes are used in the second layer (upper layer) of the recording layer having a multilayer structure, the addition amount may be selected more freely as there are no problems associated with the printing efficiency at the substrate interface. Thus, the pigments or dyes may be added in an amount of 0.01 to 50% by mass, preferably of 0.1 to 40% by mass, particularly preferably of 0.5 to 30% by mass with respect to the total amount of the solid contents.

[Other Components]

In addition to the components described above, various other components may be added if desired to the photo/thermosensitive layer (recording layer) of the image recording material according to the invention, if the addition thereof does not interfere with the technical merits of the invention.

The useful additives include, for example, such as onium salts, aromatic sulfone compounds, aromatic sulfonic ester compounds, and multifunctional amine compounds, the compounds allow increased suppression of solubilization of the polymers soluble in aqueous alkaline solutions (alkali-soluble resins) into the developer (hereinafter, referred to as solubilization-suppressing agents). Among them, it is preferable to use substances that are heat labile and substantially reduce the solubility of the alkali-soluble resin when present in undecomposed state, such as onium salts, o-quinone diazide compounds, and sulfonic alkylesters, from the viewpoint of increasing the potential of suppressing solubilization of the image portions into the developer. Preferable as the heat-labile solubilization-suppressing agent are onium salts such as diazonium salts, iodonium salts, sulfonium salts, and ammonium salts; and o-quinone diazide compounds, and more preferable are onium salts such as diazonium salts, iodonium salts, and sulfonium salts.

Favorable examples of the onium salts used in the invention include diazonium salts described in S. I. Schlesinger, Photogr. Sci. Eng., 18, 387 (1974), T.S. Baleet al., Polymer, 21, 423 (1980), and JP-A No. 5-158230; ammonium salts described in U.S. Pat. Nos. 4,069,055 and 4,06956, and JP-A No. 3-140140;

phosphonium salts described in D. C. Necker et al., Macromolecules, 17, 2468 (1984), C. S. Wen et al., Teh. Proc. Conf. Rad-Curing ASIA, p.478 Tokyo, October (1988), and U.S. Pat. Nos. 4,069,055 and 4,069,056; iodonium salts described in J. V. Crivello et al., Macromolecules, 10 (6), 1307 (1977), Chem. & Eng. News, November 28, p31 (1988), EP Patent No. 104,143, U.S. Pat. Nos. 5,041,358 and 4,491,628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem., Ed., 22, 1789 (1984), J. V. Crivello et al., Polymer Bull., 14, 279 (1985), J. V. Crivello et al, Macromolecules, 14 (5), 1141 (1981), J. V. Crivello et al., J. Polymer Sci., Polymer Chem. Ed., 17,2877 (1979), EP Patent Nos. 370,693, 233,567, 297,443, and 297,442, U.S. Pat. Nos. 4,933,377, 3,902,114, 5,041, 358, 4,491,628, 4,760,013, 4,734,444, and 2,833,827, and Germany Patent Nos. 2,904,626, 3,604,580, and 3,604,581; selenonium salts described in J. V. Crivello et al., Macromolecules, 10 (6), 1307 (1977), J. V. Crivello et al., J. Polymer Sci., and Polymer Chem. Ed., 17, 1047 (1979); and arsonium salts described in C. S. Wen et al., Teh. Proc. Conf. Rad. Curing ASIA, p.478, Tokyo, Oct (1988).

Among these onium salts, diazonium salts are particularly preferable from the viewpoints of solubilization-suppressing potential and thermal decomposability. In particular, the diazonium salts represented by the General Formula (I) disclosed in JP-A No. 5-158230 and the diazonium salts represented by the General Formula (1) disclosed in JP-A No. 11-143064 are preferable, and the diazonium salts represented by the General Formula (1) described in JP-A No. 11-143064, which absorb light at a smaller wavelength in the visible light region are most preferable.

The counter ions for the onium salts include tetrafluoroborate, hexafluorophosphate, triisopropylnaphthalenesulfonate, 5-nitro-O-toluenesulfonate, 5-sulfosalicylate, 2,5-dimethylbenzenesulfonate, 2,4,6-trimethylbenzenesulfonate, 2-nitrobenzenesulfonate, 3-chlorobenzenesulfonate, 3-bromobenzenesulfonate, 2-fluorocaprylnaphthalenesulfonate, dodecylbenzenesulfonate, 1-naphthol-5-sulfonate, 2-methoxy-4-hydroxy-5-benzoyl-benzenesulfonate, and para-toluenesulfonate. Among these ions, hexafluorophosphate and alkylaromatic sulfonates such as triisopropylnaphthalenesulfonate and 2,5-dimethylbenzenesulfonate are particularly preferable.

Favorable quinone diazides include o-quinone diazide compounds. o-Quinone diazide compounds used in the invention are compounds that have at least one o-quinone diazide group and become more alkali-soluble by thermal decomposition; and compounds having various structures may be used. o-Quinone diazide compounds assist solubilization of the solid contents in photosensitive layers, by losing the solubilization-suppressing potential thereof by thermal decomposition and by changing to alkali-soluble substances by themselves.

As the o-quinone diazide compounds used in the invention, preferable are, for example, the compounds described in J. Corsair, Ed., “light sensitive systems” (John Wiley & Sons, Inc.) pp.339 to 352, and particularly preferable are sulfonic esters or amides of the o-quinone diazides which were reacted with various aromatic polyhydroxy or aromatic amino compounds.

In addition, the esters prepared from benzoquinone-(1,2)-diazide sulfonylchloride or naphthoquinone-(1,2)-diazide-5-sulfonyl chloride and pyrogallol-acetone resins as described in JP-B No. 43-28403; and esters prepared from benzoquinone-(1,2)-diazide sulfonylchloride or naphthoquinone-(1,2)-diazide-5-sulfonylchloride and phenol-formaldehyde resins as described in U.S. Pat. Nos. 3,046,120 and 3,188,210 may also be favorably used.

Further, esters prepared from naphthoquinone-(1,2)-diazide-4-sulfonylchloride and phenol formaldehyde or cresol formaldehyde resins and esters and prepared from naphthoquinone-(1,2)-diazide-4-sulfonylchloride and pyrogallol-acetone resins may also favorably used. Other useful o-quinone diazide compounds are reported and disclosed in many patents and patent applications.

Examples of those o-quinone diazide compounds include compounds described in JP-A Nos. 47-5303, 48-63802, 48-63803, 48-9,6575, 49-38701, and 48-13354; JP-B Nos. 41-11222, 45-9610, and 49-17481; U.S. Pat. Nos. 2,797,213, 3.454,400, 3,544,323, 3,573.917, 3,674,495, and 3.785,825; U.K. Patent Nos. 1,227,502, 1,251,345, 1,267,005, 1,329,888, and 1,330.932; and Germany Patent No. 854,890.

The addition amount of the decomposable solubilization-suppressing agent, an onium salt and/or an o-quinone diazide, is preferably in the range of 1 to 10% by mass, more preferably of 1 to 5% by mass, particularly preferably of 1 to 2% by mass with respect to the total solid contents in the recording layer. These compounds may be used alone or as a mixture of several compounds.

The addition amount of additives other than quinone diazide compounds is preferably 0.1 to 5% by mass, more preferably 0.1 to 2% by mass, and particularly preferably 0.1 to 1.5% by mass. The additives according to the invention and the solubilization suppressor are preferably contained in the same layer.

In addition, non-decomposable solubilization-suppressing agents may also be used together, and preferable examples of such solubilization-suppressing agents include sulfonic, phosphoric, and aromatic carboxylic esters, aromatic disulfones, carboxylic anhydrides, aromatic ketones, aromatic aldehydes, aromatic amines, aromatic ethers, and the like described in detail in JP-A No. 10-268512; acid-coloring dyes functioning also as a solubilization suppressor that have a lactone, N,N-diarylamide, or diarylmethylimino backbone described in detail in JP-A No. 11-190903: and nonionic surfactants described in detail in JP-A No. 2000-105454.

For the purpose of further improving the sensitivity, cyclic acid anhydrides, phenols, and organic acids may be used together as additives. Additionally, surfactants, image coloring agents, and plasticizers described below are also included in the commonly used additives.

The cyclic acid anhydrides usable in the invention include phthalic anhydride, tetrahydrophthalic anhydride, hexahydrophthalic anhydride, 3,6-endohydroxy-Δ4-tetrahydrophthalic anhydride, tetrachlorophthalic anhydride, maleic anhydride, chloromaleic anhydride, α-phenylmaleic anhydride, succinic anhydride, pyromellitic anhydride and the like, as described in U.S. Pat. No. 4,115,128. The phenols include bisphenol A, p-nitrophenol, p-ethoxyphenol, 2,4,4"-trihydroxybenzophenone, 2,3,4-trihydroxybenzophenone, 4-hydroxybenzophenone, 4,4",4"-trihydroxytriphenylmethane, 4,4",3",4"-tetrahydroxy-3,5,3",5"-tetramethyltriphenylmethane. Further, the organic acids include sulfonic, sulfinic, alkylsulfuric, and phosphonic acids, phosphoric esters and carboxylic acids, as described in JP-A Nos. 60-88942 and 2-96755, and others.

The content of the cyclic acid anhydride, phenol and organic acid in the recording layer is preferably 0.05 to 20% by mass, more preferably 0.1 to 15% by mass, and particularly preferably 0.1 to 10% by mass.

In addition to the compounds above, epoxy compounds, vinylethers, phenol compounds having a hydroxymethyl group and phenol compounds having an alkoxymethyl group described in JP-A No. 8-276558, and crosslinking compounds having an alkali solubilization-suppressing potential proposed by the inventors in JP-A No. 11-160860, and the like may be added as needed.

In addition, into the coating solution for preparing the recording layer according to the invention may be added nonionic surfactants described in JP-A Nos. 62-251740 and 3-208514; amphoteric surfactants described in JP-A Nos. 59-121044 and 4-13149; siloxane compounds described in EP No. 950517; and copolymers of fluorine-containing monomers described in JP-A No. 11-238093, for the purpose of improving processability under the developing condition.

Typical examples of the nonionic surfactants include sorbitan tristearate, sorbitan monopalmitate, sorbitan trioleate, stearic monoglyceride, and polyhydroxyethylene nonylphenylether. Typical examples of the amphoteric surfactants include alkyldi(aminoethyl)glycines, alkylpolyaminoethylglycine hydrochlorides, 2-alkyl-N-carboxyethyl-N-hydroxyethylimidazolinium betaines and N-tetradecyl-N,N-betaines (e.g., “Amorgen K” manufactured by Daiichi Kogyo).

The siloxane compounds are preferably block copolymers of dimethylsiloxane and polyalkylene oxides, and specific examples thereof include polyalkylene oxide-modified silicones such as DBE-40224, DBE-621, DBE-712, DBP-732, and DBP-534 manufactured by Chisso Corp., and Tego Glide 100 manufactured by Tego in Germany.

The content of the nonionic surfactants and amphoteric surfactants in the photosensitive composition is preferably 0.95 to 15% by mass, and more preferably 0.1 to 5% by mass.

In addition, dyes and pigments may be added as printing-out agents and image-coloring agents for obtaining visible images immediately after heating by exposure to light.

The printing-out agents are typically combinations of a compound that releases an acid by the heat due to exposure to light (photo-induced acid-releasing agent) and an organic dye that can form a salt with the acid. More specifically, examples thereof include combinations of o-naphthoquinone diazide-4-sulfonic halide and salt-forming organic dyes described in JP-A Nos. 50-36209 and 53-8128; and combinations of a trihalomethyl compound and salt-forming organic dyes described in JP-A Nos. 53-36223, 54-74728, 60-3626, 61-143748, 61-151644 and 63-58440. The trihalomethyl compounds include oxazole compounds and triazine compounds, both of which provide distinct baked-out images excellent in storability.

In addition to the salt-forming organic dyes described above, other dyes may be used as the image-coloring agent. Favorable dyes including the salt-forming organic dyes are for example oil-soluble dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (manufactured by Orient Chemical Industries); Victoria Pure Blue, crystal violet (CI 42555), methyl violet (CI 42535), ethyl violet, rhodamine B (CI 145170B), malachite green (CI 42000), and methylene blue (CI 52015). In addition, the dyes described in JP-A No.62-293247 are particularly preferable. These dyes may be added into the recording layer in an amount of 0.01 to 10% by mass, preferably 0.1 to 3% by mass with respect to the total solid contents in the recording layer.

In addition, plasticizers are added if desired into the recording layer for improving the plasticity of the coated layer, and examples thereof include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic or methacrylic acids.

[Formation of Image Recording Material]

For preparing the image recording material according to the invention, a coating solution for the recording material layer, wherein the components described above to be included in the recording layer are dissolved in a solvent, may be applied onto a suitable support. The recording layer may have either a single-layered structure consisting only of an infrared laser-sensitive photo/thermosensitive layer or a multiple-layered structure having the first layer (lower layer) soluble in the alkaline developer on the support and the second layer (upper layer) sensitive to infrared laser atop the first layer. If the recording layer has a multilayer structure, the component (C), the essential component of the invention, may be contained either in the lower or upper layer, or in both layers, but is preferably contained at least in the lower layer from the viewpoint of improving image quality (resolution).

In addition, protective, undercoat, back-coat and other layers described below may also be formed in addition to the recording layer(s) in the image recording material according to the invention, depending on the purpose.

Examples of the solvents used therein include, but are not limited to, ethylene dichloride, cyclohexanone, methylethylketone, methanol, ethanol, propanol, ethylene glycol monomethylether, 1-methoxy-2-propanol, 2-methoxyethyl acetate, 1-methoxy-2-propyl acetate, dimethoxymethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, and toluene. These solvents may be used alone or in combination.

The concentration of the components above (all solid contents including additives) in the solvent is preferably 1 to 50% by mass.

The coating amount (as solid contents) of the recording layer formed on the support after application and drying varies according to the application, but if the plate is used as an planographic printing plate precursor, generally it is preferably 0.5 to 5.0 $g/m^2$ in the case of a single-layered structure. As the coating amount decreases, the apparent sensitivity increases but the film property of recording layer decreases.

Various methods may be used for the application, and examples thereof include bar coater coating, rotational coating, spray coating, curtain coating, dip coating, air knife coating, blade coating, and roll coating.

Hereinafter, the photo/thermosensitive layers having a multilayer structure according to the invention will be described in detail. The recording layer having a multilayer structure consists of the first layer (lower layer) soluble in an aqueous alkaline solution and the second layer (upper layer) that become more soluble in the alkaline developer upon exposure to infrared laser, and the specific ester compound (C) according to the invention should be contained at least in one of the first and second layers.

In the case of the recording layer having such a structure, as the upper layer has a favorable membrane strength and a resistance to alkali developer when not exposed to light in the image regions, the surface of the image portion has a high resistance to alkaline developer. However in exposed portion, i.e., in nonimage regions, once the resistance to the developer provided by the solubilization-suppressing agent is rapidly removed by exposure to light, the upper layer is removed in development, exposing the lower layer having a high printing efficiency that is soluble in the alkaline developer, which in turn is removed rapidly due to its own high solubility into the aqueous alkaline solution, exposing the hydrophilic support and consequently forming excellent images without scums in the non-image regions.

First, the second layer (upper layer), which increases solubility thereof to (becomes more soluble in) the alkaline developer upon exposure to infrared laser, will be described. The upper layer may have the same configuration as the photo/thermosensitive layer described above except that it does not demand the specific ester compound (C) described above as the essential component, and the preferable components therein are also the same.

The upper layer may also contain the specific ester compound (C), and may not contain it if the lower layer described below contains the specific ester compound (C).

Next, the lower layer will be described.

The lower layer according to the invention should be soluble in the alkaline developer, and is preferably contains an alkali-soluble resin as the main component from this viewpoint. The alkali-soluble resins used in the lower layer are preferably the same as the alkali-soluble resin (A) described for the photo/thermosensitive layer. Among them, resins more resistant to forming interactions and greater in solubility in the alkaline developer than the alkali-soluble resin used in the upper layer described below are preferably selected, from the viewpoints of sensitivity and image-forming property, and favorable examples thereof include polyamide, epoxy, acetal, acrylic, methacrylic, styrene, and urethane resins.

As the alkali-soluble resins used in the lower layer, preferably selected are resins lower in solvent solubility, i.e., that are not dissolved, when the upper layer solution is applied thereon, in the coating solvent for the upper layer components. Proper choice of the resin allows suppression of undesirable solubilization at the interface between the two layers. From this viewpoint, acetal, acrylic, and urethane resins are particularly preferable among them.

The content of the alkali-soluble resin in the components of the lower layer according to the invention is preferably about 40 to 95% by mass, more preferably about 50 to 90% by mass with respect to the total solid contents.

In addition to the alkali-soluble resin above, the infrared absorbent and various additives described above may be added to the lower layer. In addition, the lower layer preferably contains the specific ester compound (C) from the viewpoint of merit.

When present in lower layer, the specific ester compound (C) according to the invention is contained preferably in an amount of 0.01 to 50.0% by mass, particularly preferably of 0.5 to 30.0% by mass, with respect to the total solid contents of the lower layer.

The specific ester compound (C) above may be added into the upper layer, and the preferable addition amount thereof is in the range preferably of 0.01 to 50.0% by mass, particularly preferably of 0.5 to 30.0% by mass, with respect to the total solid contents of the upper layer.

The lower and upper layers are preferably formed separately in principle.

The method for forming the two layers separately is, for example, a method by using the difference in solubility in solvents between the components contained in the lower layer and those contained in the upper layer, or a method of rapidly drying and removing the solvent used for the upper layer after application thereof.

In the invention, if the recording layer has a multilayer structure, the coating amount of the components after drying in the lower layer formed on the support is in the range preferably of 0.05 to 1.5 g/m$^2$, and more preferably of 0.1 to 1.0 g/m$^2$. Such recording layers having the components in this range allow significant increase in printing durability, favorable image reproducibility, and high-sensitivity recording.

The coating amount of the components after drying in the upper layer components is in the range preferably of 0.05 to 3.5 g/m$^2$ and more preferably 0.1 to 1.5 g/m$^2$. Such recording layers having the components in this preferable range allow high-sensitivity recording and significant increase in printing durability.

The coating amount of the components in the lower and upper layers combined is in the range preferably of 0.5 to 5.0 g/m$^2$ and more preferably 1.0 to 3.0 g/m$^2$.

Surfactants for improving coating property, such as the fluorochemical surfactants described in JP-A No. 62-170950, may be added into the recording layer coating solution according to the invention. The preferable addition amount is 0.01 to 1% by mass, more preferably 0.05 to 0.5% by mass, with respect to the total solid contents in the recording layer.

[Support]

The support for the image recording material according to the invention is not particularly limited if it is a plate-like material having dimensional stability and needed physical properties such as strength and flexibility, and examples thereof include: papers; papers laminated with a plastic film (e.g., polyethylene, polypropylene, polystyrene, etc.); metal plates (e.g., aluminium, zinc, copper, etc.); plastic films (e.g., cellulose diacetate, cellulose triacetate, cellulose propionate, cellulose butyrate, cellulose acetate butyrate, cellulose nitrate, polyethylene terephthalate, polystyrene, polypropylene, polycarbonate, polyvinylacetal, etc.); papers laminated with a metal foil or deposited with a metal; and plastic films.

The support usable in the invention is preferably a polyester film or aluminium plate, and particularly preferable an aluminium plate, as it is superior in dimensional stability and relatively cheap. Favorable aluminium plates are pure aluminium plates and alloy plates containing aluminium as the main component and small amounts of foreign elements, or may be plastic films laminated with aluminium or deposited with aluminum. The foreign elements in the aluminium alloys include silicon, iron, manganese, copper, magnesium, chromium, zinc, bismuth, nickel, and titanium. The content of the foreign elements in the alloy is 10% by mass or less. Although the most preferable aluminium in the invention is pure aluminium, the aluminum plate may contain a small amount of foreign elements, as it is difficult to prepare completely pure aluminium due to the problems in refining process.

As described above, the aluminium plates to be used in the invention are not particularly specified, and any one of the aluminium plates known and used in the art may be used arbitrarily. The thickness of the aluminium plates used in the invention is about 0.1 to 0.6 mm, preferably 0.15 to 0.4 mm, and particularly preferably 0.2 to 0.3 mm.

If desired, the surface of the aluminum plate is subjected, before surface roughening, to degreasing treatment for removing the rolling oils on the surface thereof, with a surfactant, organic solvent, aqueous alkaline solution, or the like. Various methods may be used for surface roughening of aluminium plates, and examples thereof include methods of scratching mechanically, dissolving the surface electrochemically, and dissolving selectively the surface chemically. The mechanical methods include methods known in the art such as ball milling, brush milling, blast milling, and buff milling. The electrochemical surface roughening may be conducted, for example, in an electrolyte containing hydrochloric acid or nitric acid by applying alternate or direct current. Alternatively, the combined mechanical and electrochemical method described in JP-A No. 54-63902 may also be sued. The aluminium plate scratched in this manner is etched in an alkaline solution and neutralized as needed, and then subjected to an anodizing process if desired for improvement in the water holding property and abrasion resistance of the surface. Various electrolytes that can form porous oxide layer may be used as the electrolyte used in the anodizing process of the aluminium plates, and generally include sulfuric acid, phosphoric acid, oxalic acid, chromic acid and the mixture thereof. The concentrations of these electrolytes are decided according to the kinds of the electrolytes.

The conditions for the anodic oxidation vary according to the electrolytes used and are not particularly specified, but are generally suitable if the concentration of the electrolytes is 1 to 80% by mass; liquid temperature, 5 to 70° C.; the electric current density, 5 to 60 A/dm$^2$; the voltage, 1 to 100 V; and the electrolysis period, 10 seconds to 5 minutes. The anodized layer formed on the film in an amount of less than 1.0 g/m$^2$ tends to provide insufficient printing durability and the non-image portions of the planographic printing plate more susceptible to damages, and consequently the problems of "scratch staining" that inks adhere to the damaged portions during printing. After the anodizing process, the aluminium surface is hydrophilized as needed.

An example of the hydrophilizing treatment used in the invention is the treatment with an alkali metal silicate (e.g., aqueous sodium silicate solution) disclosed in U.S. Pat. Nos. 2,714,066, 3,181,461, 3,280,734 and 3,902,734. By this method, the support is soaked and treated in an aqueous sodium silicate solution or electrolyzed. Alternatively, the support may be subjected to the methods of treating it with potassium fluorozirconate disclosed in JP-B No. 36-22063 and of treating it with polyvinylphosphonic acid disclosed in U.S. Pat. Nos. 3,276,868, 4,153,461, and 4,589,272.

The image recording material according to the invention is a positive-type recording layer formed on a support, but an undercoat layer may be placed between the support and the recording layer if needed.

Various organic compounds may be used as the components for the undercoat layer, and examples thereof include carboxymethyl cellulose, dextrin, gum arabic, phosphonic acids having one or more amino groups such as 2-aminoethylphosphonic acid; organic phosphonic acids such as phenylphosphonic acid, naphthylphosphonic acid, alkylphosphonic acid, glycerophosphonic acid, methylenediphosphonic acid, and ethylenediphosphonic acid, which may have one or more substituents; organic phosphoric acids such as phenylphosphoric acid, naphthylphosphoric acid, alkylphosphoric acid, and glycerophosphoric acid, which may have one or more substituents; organic phosphinic acid such as phenylphosphinic acid, naphthylphosphinic acid, alkylphosphinic acid, and glycerophosphinic acid, which may have one or more substituent; amino acids such as glycine and β-alanine; amine phosphate salts having one or more hydroxyl groups such as triethanolamine hydrochloride; and the mixture thereof.

These organic undercoat layers may be formed by the following methods of: applying a solution of the organic compounds above in water; an organic solvent such as methanol, ethanol, or methylethylketone; or a mixed solvent thereof onto the aluminium plate, and drying the film; and immersing the aluminium plate in a solution of the organic compound above in water; an organic solvent such as methanol, ethanol, or methylethylketone; or a mixed solvent thereof for absorption of the above compounds thereon, and then washing the plate with water or another solvent, and drying the plate. By the former method, solutions of the above organic compounds at a concentration of 0.005 to 10% by mass can be applied by various methods. Alternatively by the latter method, the concentration of the organic compounds in the solution is 0.01 to 20% by mass, preferably 0.05 to 5% by mass; the immersion temperature, 20 to 90° C., preferably 25 to 50° C.; and the immersion period, 0.1 second to 20 minutes, preferably 2 seconds to 1 minute.

The solution for this purpose may be adjusted to a pH in the range of 1 to 12 by addition of a basic substance such as ammonia, triethylamine, or potassium hydroxide, or an acidic compound such as hydrochloric acid, or phosphoric acid. Further, a yellow dye may also be added for improvement in printing reproducibility of the image recording material.

The coating amount after drying of the organic undercoat layer(s) is suitably 2 to 200 mg/$m^2$, preferably 5 to 100 mg/$m^2$. Those recording materials having the undercoating layer in the above range provide favorable improvement in printing durability.

The image recording materials according to the invention prepared as described above can be used favorably as planographic printing plate precursors, which are commonly exposed to images and developed. Hereinafter, the image-recording method using the image recording materials according to the invention as the planographic printing plate precursors will be described.

With respect to exposure condition, the exposure energy density is preferably more than 5 to 10 kW/$cm^2$ from the viewpoint of efficient utilization of heat during the image-forming process, and exposure under such condition provides favorable sensitivity. Although higher exposure energy density is advantageous in providing higher sensitivity, an exposure power density of over 50 kW/$cm^2$ sometimes leads to ablation and consequently to adverse effects such as disturbances in the optical system.

The exposure wavelength is preferably in the range from near-infrared to infrared, from the viewpoint of the economical efficiency of the current high-output lasers. The light source is preferably a solid state or semiconductor laser, from the viewpoints of the economical efficiency and lifetime of the light source.

Various aqueous alkaline solutions hitherto known in the art may be used as the developing and replenishing solutions for the planographic printing plates according to the invention.

Examples of such alkalis include inorganic alkali salts such as sodium silicate, potassium silicate, tribasic sodium phosphate, tribasic potassium phosphate, tribasic ammonium phosphate, bibasic sodium phosphate, bibasic potassium phosphate, bibasic ammonium phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. Additionally, organic bases such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, and pyridine may be also used for the alkaline solution. These basic compounds may be used alone or in combination of tow or more compounds.

Among many alkaline solutions, a particularly preferable developer is an aqueous silicate solution containing sodium silicate, potassium silicate, or the like. It is because proper selection of the ratio of silicon oxide $SiO_2$ (a component of silicate salt) to an alkali metal oxide $M_2O$ and the concentrations thereof allows control of the printing efficiency. For example, the alkali metal silicates described in JP-A No. 54-62004 and JP-B No. 57-7427 may be efficiently used.

When an automatic developing machine is used for development, it is known that addition of an aqueous solution higher in alkali strength than the developer (replenishing solution) to the developer allows processing of numerous offset printing plates (PS plates) without the need for replacement of the developer in the developer tank for an extended period of time. The replenishing method is favorably applied also to the invention. Various surfactants and organic solvents may be added if needed to the developing and replenishing solutions for the purpose of accelerating or suppressing the printing efficiency, dispersing the development scums, and improving the hydrophilicity of the image portions of the printing plate.

Preferable surfactants include anionic, cationic, nonionic and amphoteric surfactants. In addition, hydroquinone, resorcin, a reducing agent such as sodium or potassium salt of an inorganic acid such as sodium or potassium sulfite and bisulfite, an organic carboxylic acid, an antifoam agent, and/or a water softener may be added if needed to the developing and replenishing solutions.

The printing plate processed using the developing and replenishing solutions is then post-treated with washing water, a rinsing solution containing surfactants and the like, and/or a desensitizing solution containing gum arabic or a starch derivative. If used as a planographic printing plate, the image recording material according to the invention may be post-processed in combination of these treatments.

Recently, automatic-developing machines for the printing plates have been widely used for the purpose of streamlining and standardizing the plate-making processes in the printing-plate and printing industries.

The automatic developing machines generally consist of a developing unit, a post-treatment unit, a unit for conveying printing plates, various solution stock tanks, and units for spraying the solutions, wherein the exposed printing plates are developed while they are conveyed horizontally and sprayed via spray nozzles with the solutions pumped out from the tanks.

Also known is another kind of automatic developing systems, wherein the printing plates are conveyed while soaked in treatment solution tanks filled with treating solutions one after another by means of the submerged guide rolls or the like.

In such automatic processing, the plates are processed while the solution tanks are periodically replenished with the replenishing solutions according to the number of the plates and the period of processing. In addition, the method of using only essentially unused treating solutions, i.e., single-round method, may also be used in the invention.

With respect to the planographic printing plate precursors according to the invention, if the planographic printing plate obtained after the steps of image exposure, development, water and/or rinsing, and/or gumming has undesirable image portions (e.g., film edge spots of original image films and the like), the undesirable image portions are omitted. As the elimination method, preferable is for example the method described in JP-B No. 2-13293 wherein an image-elimination solution is applied onto the undesirable image portions and the resulting plate is then washed with water after being left for a certain period; but the method described in JP-A No. 59-174842, wherein the undesirable image portions are omitted by irradiation of an activated light lead through an optical fiber and then the resulting plate is developed, may be also used.

The developed planographic printing plate thus obtained may further coated with a desensitizing gum if desired before it is sent to the printing process; or the plate is additionally subjected to a burning treatment if desired for the purpose of obtaining planographic printing plates higher in printing durability.

If the planographic printing plates are to be burned, the plates are preferably treated before the burning treatment with an affinitizing solution described in JP-B Nos. 61-2518 and 55-28062 and JP-A Nos. 62-31859 and 61-159655.

The methods include application of the affinitizing solution onto planographic printing plate with sponge or cotton moistened therewith, application by immersing the printing plate into a bath filled with the affinitizing solution, and application by an automatic coater. Additionally, adjustment of the coating amount to uniformity by using a squeezee or a squeezee roller after application of the affinitizing solution provides further preferable results.

The suitable coating amount of the affinitizing solution is generally 0.03 to 0.8 $g/m^2$ (as dry weight). The planographic printing plate applied with the affinitizing solution is then dried if needed and heated at high temperature in a burning processor (e.g., Burning Processor BP-1300 sold by Fuji Photo Film Co., Ltd.). The temperature and the period of the heating vary according to the kind of the components constituting the images, but are preferably in the range of 180 to 300° C. and of 1 to 20 minutes.

The planographic printing plate after the burning treatment may be then subjected if needed to treatments commonly practiced in the art such as water washing and gumming, but if an affinitizing solution containing a water-soluble polymer compound or the like is used, so-called desensitizing treatments such as gumming and the like may be omitted. The planographic printing plates obtained after these treatments are then supplied to an offset printing machine or the like, and the planographic printing plates are used for printing numerous papers.

EXAMPLES

Hereinafter, the present invention will be described in detail with reference to Examples, but it should be understood that the invention should not deemed to be limited thereto. In the Examples of the invention, the image recording materials according to the invention were evaluated as a planographic printing plate precursor, and the results are regarded as those of the image recording material according to the invention.

[Preparation of Supports]

The supports were prepared by a combination of the following steps with the use of JIS-A-1050 aluminium plates having a thickness of 0.3 mm.

(a) Mechanical Surface Roughening Treatment

The aluminum plates were mechanically scratched with nylon brushes of a rotating roller, while a suspension of an abrasive (quartz sand), having a specific density of 1.12, and water was supplied as the abrasion slurry solution. The average diameter of the abrasive was 8 μm, and the maximum diameter thereof 50 μm.

The nylon brushes made of 6·10 nylon had a length of 50 mm and a diameter of 0.3 mm. The nylon brushes were planted densely in the holes of the stainless steel cylinder having a diameter of φ300 mm. Three rotating brush rollers were used. The distance between the two supporting rollers (φ200 mm) positioned below the brushes was 300 mm. The brush rollers were pressed against the aluminium plates until the loads of the driving motors became 7 kW greater than the loads which had existed before the brush rollers had been pressed. The rotative direction of the brushes was identical to the moving direction of the aluminium plates. The rotational frequency of the brushes was 200 rpm.

(b) Alkaline Etching Treatment

The aluminium plates thus obtained were subjected to an etching treatment by means of spraying an aqueous NaOH solution (NaOH concentration, 26% by mass; and aluminium ion concentration, 6.5% by mass) at a temperature of 70° C., until the plates were dissolved to an extent of 6 $g/m^2$. Subsequently, the plates were washed by means of spraying water.

(c) Desmutting Treatment

The aluminum plates were subjected to a desmutting treatment by means of spraying at a temperature of 30° C. an aqueous solution containing 1% by mass nitric acid (including additionally 0.5% by mass aluminium ions). The aluminum plates were then washed by means of spraying water. Wastewater from a electrochemical surface roughening treatment, in which the aluminum plates had been electrochemically scratched in an aqueous nitric acid solution using an alternate current, was used for desmutting as the aqueous nitric acid solution.

(d) Electrochemical Surface Roughening Treatment

The electrochemical surface roughening treatment was performed continuously by using a 60 Hz alternate current on the aluminum plates. The electrolyte used was an aqueous solution containing 10.5 g/L of nitric acid (containing additionally 5 g/L of aluminium ions) at a temperature of 50° C. The electrochemical surface roughening was performed by using as an alternate current waveform a trapezoidal alternate current having a trapezoidal waveform with a transition period (TP) from zero to peak currency of 0.8 msec and a DUTY ratio of 1:1, and with a carbon electrode as the counter electrode. Ferrite was used as the auxiliary anode. The electrolytic bath used was that of a radial cell type.

When an aluminium plate was used as the anode, the electric current density was 30 $A/dm^2$ at a maximum, and the total amount of electric current applied was 220 $C/dm^2$. A part (5%) of the current from the power source was siphoned off and sent to the auxiliary electrode.

Subsequently, the aluminum plates were washed by means of spraying water.

(e) Alkaline Etching Treatment

The aluminium plates were etched to an extent of 0.20 $g/m^2$ by means of spraying a solution containing 26% by mass caustic soda and 6.5% by mass aluminium ions, at 32° C. Smuts including mainly aluminum hydroxide generated during the previous electrochemical surface roughening treatment, in which an alternate current had been used, were removed and the edge portions were polished by dissolving the edge portions of pits thus generated. Subsequently, the aluminum plates were washed by means of spraying water.

(f) Desmutting Treatment

The aluminum plates were desmutted by spraying an aqueous solution including 15% by mass nitric acid (including additionally 4.5% by mass aluminium ions) at a temperature 30° C., and then washed by means of spraying water. Wastewater from the electrochemical surface-roughening step, in which the electrochemical surface roughening treatment had been performed in an aqueous nitric acid solution an using alternate current, was used for desmutting as the aqueous nitric acid solution.

(g) Electrochemical Surface Roughening Treatment

The electrochemical surface roughening treatment was performed continuously by using a 60-Hz alternate current. The electrolyte used was an aqueous solution including 7.5 g/L of hydrochloric acid (including additionally 5 g/L of aluminum) at a temperature of 35° C. The electrochemical surface roughening treatment was performed, using an alternate current having a trapezoidal waveform, and with a carbon electrode as the counter electrode. Ferrite was used as the auxiliary anode. The electrolytic bath used was that of the radial cell type.

The electric current density was 25 $A/dm^2$ at a maximum, and the total amount of electric current applied when an aluminium plate was used as the anode was 50 $C/dm^2$.

Subsequently, the aluminum plates were washed by means of spraying water.

(h) Alkaline Etching Treatment

The aluminium plates were etched to an extent of 0.10 $g/m^2$ by means of spraying a solution containing 26% by mass caustic soda and 6.5% by mass aluminium ions at 32° C. Smuts including mainly aluminum hydroxide generated during the previous electrochemical surface roughening treatment, in which an alternate current had been used, were removed and the edge portions were polished by dissolving the edge portions of pits thus generated. Subsequently, the aluminum plates were washed by means of spraying water.

(i) Desmutting Treatment

The aluminum plates were desmutted by spraying an aqueous solution including 25% by mass sulfuric acid (including additionally 0.5% by mass aluminium ions) at a temperature 60° C., and then washed by means of spraying water.

(j) Anodizing Process

Sulfuric acid was used as the electrolyte. The electrolyte used included 170 g/L of sulfuric acid (including additionally 0.5% by mass aluminium ions) at a temperature of 43° C. Subsequently, the aluminum plates were washed by means of spraying water.

The electric current density was about 30 $A/dm^2$. The final amount of oxide in the layer thus prepared was 2.7 $g/m^2$.

The aluminum plates were processed according to steps (a) to (j) as described above, in that order, and the supports produced with the amount of etching in step (e) being maintained at 3.4 $g/m^2$.

The supports thus obtained were then subjected to the following hydrophilizing and undercoat coating treatments.

(k) Alkali Metal Silicate Salt Treatment

The aluminium supports obtained by the anodizing process were subjected to an alkali metal silicate salt treatment (silicate treatment) by means of soaking them for 10 seconds in a bath of aqueous solution including 1% by mass No.3 sodium silicate at a temperature of 30° C. Subsequently, the aluminum plates were washed by means of spraying water. The amount of silicate attached to the aluminum plates at the time was 3.6 $mg/m^2$.

(Undercoat Coating Treatment)

An undercoat solution having the following composition was coated onto the aluminium supports obtained after completion of the alkali metal silicate salt treatment, and the resulting plates were dried for 15 seconds at 80° C. The amount of the undercoat coated after drying was 15 $mg/m^2$.

| <Composition of undercoat solution> | |
|---|---|
| Polymer compound shown below | 0.3 g |
| Methanol | 100 g |
| Water | 1.0 g |

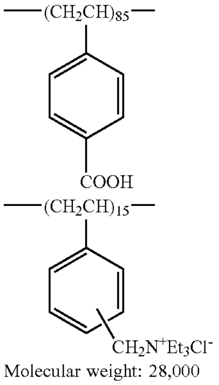

Molecular weight: 28,000

Examples 1 to 5, and Comparative Examples 1 to 3

The following coating solution 1 for the image-recording layer was applied onto the supports obtained, and the coated plates were dried for 1 minute in an oven at 150° C. Planographic printing plate precursors were produced having a positive-type image-recording layer with a thickness of 2.1 $g/m^2$ after drying.

| <Coating solution 1 for image-recording layer> a specific ester compound (C) (in the amounts indicated in Table 1) or a comparable compound (Compound indicated in Table 1) | |
|---|---|
| m,p-Cresol novolak (m/p ratio: 6/4, weight-average molecular weight: 7700, and containing 0.5% by mass unreacted cresol) | 0.10 g |
| Methacrylic acid n-butyl-methacrylic acid copolymer (mole ratio: 73:27, weight-average molecular weight: 51,000) | 0.06 g |
| Infrared absorbent shown below (cyanine dye A) | 0.03 g |
| 2,4,6-Tris(hexylhydroxy) benzenediazonium-2-hydroxy-4-methoxybenzophenone-5-sulfonate | 0.01 g |
| p-Toluenesulfonic acid | 0.002 g |
| Victoria Pure Blue BOH dye having 1-naphthalene sulfonate as the counter anion | 0.015 g |
| Fluorochemical surfactant (Megaface F-780, manufactured by Dainippon Ink and Chemicals, Inc.) | 0.02 g |
| Methylethylketone | 17 g |
| 1-Methoxy-2-propanol | 5 g |

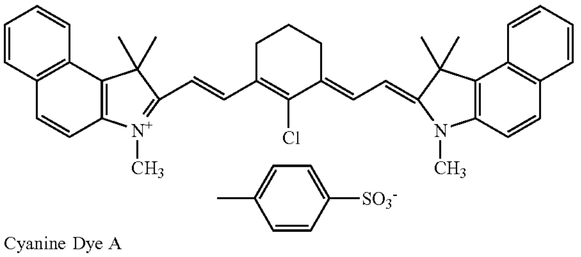

Cyanine Dye A

[Evaluation of Development Latitude]

The planographic printing plate precursors thus obtained were stored for 5 days at a temperature of 25° C. and relative humidity of 50%. A test pattern was drawn then in the shape of images by a Trendsetter 3244 manufactured by Creo, at a beam intensity of 9.0 W and a drum rotational velocity of 150 rpm.

Subsequently, a test pattern was developed with a PS Processor 900H manufactured by Fuji Photo Film Co., Ltd. containing alkaline developers with different electrical conductivities, which solutions with different electrical conductivities had been prepared respectively by varying the dilution ratio (i.e., the water content) of alkaline developers having following compositions A and B. A temperature of 30° C. was maintained, and development was completed in a period of 20 seconds. A difference between the maximum and minimum values of electrical conductivity of the developer was assessed as development latitude, which developer provided images superior in contrast, without causing either dissolution of image portions or stains and discoloration deriving from remnants of layers left behind in poorly developed recording layers. The greater the value in difference indicates superiority in development latitude, resulting in the formation of images superior in contrast. The results are summarized in Table 1.

| <Composition of alkaline developer A> | |
|---|---|
| $SiO_2$—$K_2O$ ($K_2O/SiO_2$ = 1/1 (mole ratio)) | 4.0% by mass |
| Citric acid | 0.5% by mass |
| Polyethyleneglycol laurylether (Weight-average molecular weight: 1,000) | 0.5% by mass |
| Water | 95.0% by mass |

-continued

| <Composition of alkaline developer B> | |
|---|---|
| D-sorbit | 2.5% by mass |
| Sodium hydroxide | 0.85% by mass |
| Polyethyleneglycol laurylether (Weight-average molecular weight: 1,000) | 0.5% by mass" |
| Water | 96.15% by mass |

(Evaluation of Sensitivity)

A test pattern in the shaped images was drawn on the planographic printing plate precursors obtained, at varying exposure energies, by a Trendsetter 3244 manufactured by Creo. Subsequently, patterns were developed using an alkaline developer having an intermediate (average) value in electrical conductivity, which intermediate value was the average of the highest electrical conductivity of a developer which provided images superior in contrast, without causing either dissolution of image portions or stains and discoloration deriving from remnants of layers left behind in poorly developed recording layers and the lowest electrical conductivity of a developer which achieved the same acceptable results. An exposure quantity (beam intensity at a drum rotational velocity of 150 rpm) that enabled the development of non-image portions with this developer was also determined and designated as the sensitivity. The smaller the value, the higher was deemed the sensitivity.

(Evaluation of Resolution)

Dots having an areal rate of 0.5% in the test pattern used in the above evaluation of sensitivity were exposed at an output of 7.5 W and developed. The reproducibility of images was determined by visually observing with a microscope and analyzing the shape of images, by measuring image concentration.

In this context, a reproducibility of 100% indicates that all dots had been completely reproduced, and a reproducibility of 0%, that all dots had disappeared during development. Therefore, the higher the value in reproducibility, that is, the closer to 100%, is an indication that dots developed are superior in terms of image contrast and resolution.

TABLE 1

| | Component (C)/Added amount (g) | Developer | Development latitude (mS/cm) | Sensitivity (W) | Resolution (%) |
|---|---|---|---|---|---|
| Example 1 | I-1/0.05 | A | 7 | 5.5 | 95 |
| Example 2 | I-5/0.05 | A | 7 | 6 | 96 |
| Example 3 | I-12/0.05 | B | 6 | 5.5 | 95 |
| Example 4 | I-16/0.05 | B | 6 | 5.5 | 96 |
| Example 5 | I-20/0.05 | B | 6 | 6 | 96 |
| Comparative Example 1 | None | A | 2 | 7.5 | 92 |
| Comparative Example 2 | None | B | 2 | 7.5 | 92 |
| Comparative Example 3 | p-Acetyl-phenol | A | 3 | 7 | 90 |

As is apparent from Table 1, the planographic printing plate precursors obtained in Examples 1 to 5 having a photo/thermosensitive layer including ester compound (C) according to the invention provided, both in cases where a silicate, and a non-silicate, developer were used, images superior in terms of development latitude and sensitivity, higher in resolution, and superior in terms of contrast.

In contrast, the planographic printing plate precursors obtained in Comparative Examples 1 and 2 having a photo/ thermosensitive layer which did not include the ester compound (C) according to the invention were inferior both in terms of development latitude and sensitivity and were also lower in resolution than those obtained in the Examples. In addition, the planographic printing plate precursor obtained in Comparative Example 3 in which 0.05 g of p-acetylphenol was used as the additive as a replacement for ester compound (C), was found to demonstrate a slightly more pronounced improvement in terms of sensitivity and development latitude than that obtained in Comparative Example 1 in which an additive was not used. However, this improvement was not in the category of being satisfactory from a practical point of view level and in addition a decrease in resolution was also observed.

Examples 6 to 10, and Comparative Example 4

Onto supports having an undercoat layer similar to those used in Examples 1 to 5, a coating solution for an undercoat layer having the following composition was applied with a wire bar, in a wet-coating amount of 28 ml/$m^2$ (0.8 g/$m^2$ in terms of a dry-coating amount). The resulting plates were dried for 60 seconds in a drying oven at 150° C.

Onto supports having an undercoat layer thus obtained, coating solution 2 for the image-recording layer (upper layer) having the following composition was applied with a wire bar in a wet-coating amount of 11 ml/$m^2$ (1.0 g/$m^2$ in terms of a total coating amount). Then, the plates were dried in a drying oven at 140° C. for 70 seconds, to produce positive-type planographic printing plate precursors.

<Coating solution for undercoat layer>
Ester compound (C) (Compound as indicated in Table 2, amount as indicated in Table 2)

| | |
|---|---|
| Copolymer of N-(p-aminosulfonylphenyl)methacrylamide, methyl methacrylate, and acrylonitrile (mole ratio 37:33;30, weight-average molecular weight 64,000) | 2.133 g |
| Cyanine dye A (as described above) | 0.098 g |
| Cyclohexane dicarboxylic acid anhydride | 0.100 g |
| Bis(hydroxymethyl)-p-cresol | 0.090 g |
| p-Toluenesulfonate | 0.05 g |
| Ethyl violet having 6-hydroxynaphthalenesulfonate as the counter anion | 0.100 g |
| 3-Methoxy-4-diazodiphenylamine hexafluorophosphate (thermodegradable compound) | 0.03 g |
| Fluorochemical surfactant (Megaface F-780, manufactured by Dainippon Ink and Chemicals, Inc.) | 0.035 g |
| Methylethylketone | 26.6 g |
| 1-Methoxy-2-propanoL[1] | 13.6 g |
| N,N-dimethylacetamido | 13.8 g |

<Coating solution 2 for image-recording layer (upper layer)>

| | |
|---|---|
| copolymer of methacrylic acid and isobutyl-methacrylate (mole ratio: 73:27, weight-average molecular weight: 49,000) | 0.040 g |
| Cresol novolak resin (PR-54046, manufactured by Sumitomo Bakelite) | 0.32 g |
| Cyanine dye B (having the following structure) | 0.008 g |
| Tetrabutylammonium bromide | 0.030 g |

-continued

| | |
|---|---|
| Fluorochemical surfactant (Megaface F-780, manufactured by Dainippon Ink and Chemicals, Inc.) | 0.035 g |
| 1-Methoxy-2-propanol | 40.2 g |

(Formula 27)

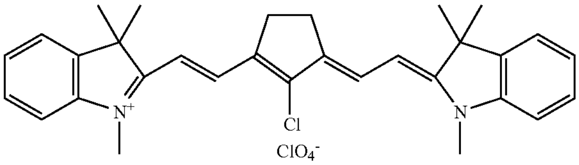

Cyanine Dye B

[Evaluation of Development Latitude and Sensitivity]

The planographic printing plate precursors thus obtained were exposed and developed in a similar manner to Examples 1 to 5, except that the developer used was the DT-1 dilution solution for developers manufactured by Fuji Photo Film Co., Ltd., and the developing time was modified to 14 seconds. The development latitude, sensitivity and resolution of the resulting films were evaluated, and the results are summarized in Table 2.

TABLE 2

| | Component (C)/Added amount (g) | Development latitude (mS/cm) | Sensitivity (W) | Resolution (%) |
|---|---|---|---|---|
| Example 6 | I-2/0.05 | 7 | 5.0 | 98 |
| Example 7 | I-11/0.05 | 7 | 4.5 | 99 |
| Example 8 | I-18/0.05 | 6 | 4.5 | 98 |
| Example 9 | I-21/0.05 | 7 | 5.0 | 99 |
| Example 10 | I-26/0.05 | 6 | 4.5 | 98 |
| Comparative Example 4 | None | 3 | 6.0 | 90 |

As is apparent from Table 2, the planographic printing plate precursors obtained in Examples 6 to 10 having a photo/thermosensitive layer including ester compound (C) according to the invention provided images superior in terms of development latitude and sensitivity, higher in resolution, and superior in contrast, confirming that precursors with multiple recording layers have the similar advantages to those with only one recording layer. In addition, even in the cases of a multilayer structure, the planographic printing plate precursor obtained in Comparative Example 4 with a photo/thermosensitive layer not including ester compound (C) according to the invention was inferior both in terms of development latitude and sensitivity, and lower in resolution than those obtained in the Examples.

Examples 11 to 13, and Comparative Example 5

Onto supports having an undercoat layer similar to those used in Examples 1 to 5, a coating solution 3 for an image-recording layer, having the following composition, was applied with a wire bar in a wet-coating amount of 19 cc/$m^2$, and the resulting plates were dried to give planographic printing plate precursors.

| <Coating solution 3 for image-recording layer> | |
|---|---|
| Ester compound (C) (compound as indicated in Table 3, amount as indicated in Table 3) | |
| Copolymer of N-(p-aminosulfonylphenyl)methacrylamide, methyl methacrylate, and acrylonitrile (mole ratio: 37:33; 30, weight-average molecular weight: 64,000) | 2.370 g |
| Cresol novolak | 0.300 g |
| Poly-o-hydroxystyrene (Mw: 20,000) (PR-54045, manufactured by Sumitomo Bakelite) | 0.2 g |
| Cyanine dye A (structure as indicated above) | 0.109 g |
| Tetrahydrophthalic anhydride | 0.190 g |
| p-Toluenesulfonic acid | 0.008 g |
| Ethyl violet having 6-hydroxynaphthalenesulfonate as the counter anion | 0.100 g |
| Dimistyryl 3,3''-thiodipropionate | 0.030 g |
| Di-N-dodecyl 3,3''-thiodipropionate | 0.030 g |
| Fluorochemical surfactant (Megaface F-780, manufactured by Dainippon Ink and Chemicals, Inc.) | 0.035 g |
| Fluorochemical surfactant (Defenser MCF-312, manufactured by Dainippon Ink and Chemicals, Inc.) | 0.035 g |
| Methylethylketone | 26.6 g |
| 1-Methoxy-2-propanol | 13.6 g |
| N,N-Dimethylacetamide | 13.8 g |

(Evaluation of Development Latitude and Sensitivity)

The planographic printing plate precursors thus obtained were exposed to light and developed according to a method similar to that used for Examples 1 to 5, and the development latitude, sensitivity, and resolution were evaluated. The results are summarized in Table 3.

TABLE 3

| | Component (C)/Added amount (g) | Development latitude (mS/cm) | Sensitivity (W) | Resolution (%) |
|---|---|---|---|---|
| Example 11 | I-3/0.05 | 6 | 5.5 | 96 |
| Example 12 | I-15/0.05 | 6 | 5.5 | 95 |
| Example 13 | I-19/0.05 | 6 | 5.0 | 95 |
| Comparative Example 5 | None | 3 | 6.5 | 90 |

As is apparent from Table 3, the planographic printing plate precursors obtained in Examples 11 to 13 having a photo/thermosensitive layer including ester compound (C) according to the invention, were found to be superior in terms of development latitude, sensitivity and resolution, even in a case where an acrylic polymer was used including an alkali-soluble resin as the main component.

As has been described in the above Examples, the image recording materials according to the invention were demonstrated to be useful as planographic printing plate precursors.

In addition, from comparisons of the contents of Tables 1 to 3, it is clear that, just as in the case of image recording materials having a signal layer structure, image recording materials with a recording layer in a multilayer structure provide images superior in terms of development latitude and sensitivity, higher in resolution, and superior in contrast, and further, that those having a recording layer in a multilayer structure with ester compound (C) in the lower layer provide images which are further enhanced in terms of sensitivity and resolution, demonstrating even more pronounced advantages of the invention observable in this embodiment.

The image recording materials according to the invention with the use of an infrared light-emitting solid state or semiconductor laser, guarantee highly-sensitive direct plate making on the basis of digital data from a computer or the like, and provide high-resolution images superior in terms of development latitude and contrast.

What is claim is:

1. An infrared laser-compatible positive-type image recording material comprising:

a support; and a photo/thermosensitive layer formed on the support, wherein the photo/thermosensitive layer includes an alkali-soluble resin (A), a photothermal converting substance (B), and an ester compound (C) represented by the following Formula (I), and increases solubility thereof to an alkaline developer as a result of exposure to an infrared laser, Formula (I)

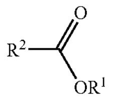

wherein, $R^1$represents a hydrocarbon group having one or more electron-withdrawing substituents and a pKa of $R^1OH$ in a range of 3 to 10; and $R^2$ represents a hydrocarbon group or a substituted carbonyl group.

2. The infrared laser-compatible positive-type image recording material according to claim 1, wherein the photo/thermosensitive layer comprises multiple layers.

3. The infrared laser-compatible positive-type image recording material according to claim 2, wherein the ester compound (C) represented by Formula (I) is included in at least one of the multiple layers.

4. The infrared laser-compatible positive-type image recording material according to claim 2, wherein the multiple photo/thermosensitive layers comprise a layer which is formed on the support and soluble in an alkaline developer, and a layer which is formed on the alkali-soluble layer and which is reactive to an infrared laser, and the ester compound (C) represented by Formula (I) is included in at least the alkali-soluble layer.

5. The infrared laser-compatible positive-type image recording material according to claim 1, wherein the electron-withdrawing substituent is selected from a halogen atom, and cyano, nitro, carboxyl, substituted carbonyl ($R^4$—C(=O)—), and substituted sulfonyl ($R^5$—S(=O)$_2$—) groups.

6. The infrared laser-compatible positive-type image recording material according to claim 1, wherein the ester compound (C) represented by Formula (I) is a compound further represented by the following Formula (II), Formula (II)

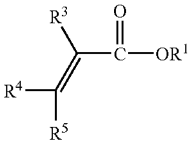

(II)

wherein $R^3$ $R^5$ each represent a hydrogen atom or a hydrocarbon group.

7. The infrared laser-compatible positive-type image recording material according to claim 1, wherein the ester compound (C) represented by Formula (I) is a compound further represented by the following Formula (III), Formula (III)

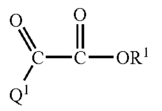

(III)

wherein $Q^1$represents a hydrocarbon group, or a substituted oxy, substituted amino, or substituted thio group.

8. The infrared laser-compatible positive-type image recording material according to claim 6, wherein the ester compound (C) represented by Formula (I) is a compound further represented by the following Formula (IV), Formula (IV)

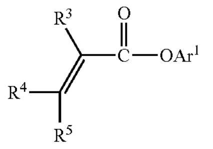

(IV)

wherein $R^3$ to $R^5$ each represent a hydrogen atom or a hydrocarbon group; and $Ar^1$ represents an aryl group having a pKa of $Ar^1OH$ in a range of 3 to 10.

9. The infrared laser-compatible positive-type image recording material according to claim 7, wherein the ester compound (C) represented by Formula (I) is a compound further represented by the following Formula (V), Formula (V)

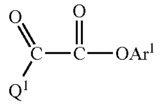

(V)

wherein $Q^1$ represents a hydrocarbon group, or a substituted oxy, substituted amino, or substituted thio group; and $Ar^1$represents an aryl group having a pKa of $Ar^1OH$ in a range of 3 to 10.

10. The infrared laser-compatible positive-type image recording material according to claim 1, wherein the ester compound (C) represented by Formula (I) is added in an amount of 0.5 to 30.0% by mass with respect to a total amount of solid contents in the photo/thermosensitive layer.

11. An infrared laser-compatible positive-type image recording material comprising:

a support;

a first layer which is formed on the support and which is soluble in an alkaline developer; and a second layer which is formed on the first layer and increases solubility thereof to the alkaline developer as a result of exposure to an infrared laser, wherein at least one of the first and second layers includes an ester compound represented by the Formula (I), Formula (I)

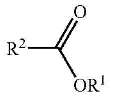

wherein, $R^1$ represents a hydrocarbon group having one or more electron-withdrawing substituents and a pKa of $R^1OH$ in a range of 3 to 10; and $R^2$ represents a hydrocarbon or substituted carbonyl group.

12. The infrared laser-compatible positive-type image recording material according to claim 11, wherein the ester compound represented by Formula (I) is included in the first layer, which is soluble in an alkaline developer.

13. The infrared laser-compatible positive-type image recording material according to claim 11, wherein at least one layer of the first and second layers includes a photothermal converting substance.

14. The infrared laser-compatible positive-type image recording material according to claim 11, wherein the electron-withdrawing substituent is selected from a halogen atom, and cyano, nitro, carboxyl, substituted carbonyl ($R^4$—C(═O)—), and substituted sulfonyl ($R^5$—S(═O)$_2$—) groups.

15. The infrared laser-compatible positive-type image recording material according to claim 11, wherein the ester compound represented by Formula (I) is a compound further represented by the following Formula (II), Formula (II)

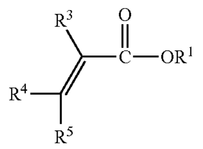

(II)

wherein, $R^1$represents a hydrocarbon group having one or more electron-withdrawing substituents and a pKa of $R^1OH$ in a range of 3 to 10; and wherein $R^3$ to $R^5$ each represent a hydrogen atom or a hydrocarbon group.

16. The infrared laser-compatible positive-type image recording material according to claim 11, wherein the ester compound represented by Formula (I) is a compound further represented by the following Formula (III), Formula (III)

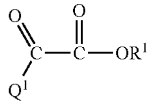

(III)

wherein, $R^1$represents a hydrocarbon group having one or more electron-withdrawing substituents and a pKa of $R^1OH$ in a range of 3 to 10; and wherein $Q^1$represents a hydrocarbon group or a substituted oxy, substituted amino, or substituted thio group.

17. The infrared laser-compatible positive-type image recording material according to claim 15, wherein the ester compound represented by Formula (I) is a compound further represented by the following Formula (IV), Formula (IV)

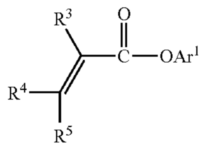

(IV)

wherein $R^3$ $R^5$ each represent a hydrogen atom or a hydrocarbon group; and $Ar^1$represents an aryl group having one or more electron-withdrawing substituents and a pKa of $Ar^1OH$ in a range of 3to 10.

18. The infrared laser-compatible positive-type image recording material according to claim 16, wherein the ester compound represented by Formula (I) is a compound further represented by the following Formula (V), Formula (V)

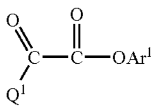

(V)

wherein $Q^1$represents a hydrocarbon group or a substituted oxy, substituted amino, or substituted thio group; and $Ar^1$ represents an aryl group having one or more electron-withdrawing substituents and a pKa of $Ar^1OH$ in a range of 3 to 10.

* * * * *